United States Patent
Maas et al.

(10) Patent No.: US 11,549,180 B2
(45) Date of Patent: Jan. 10, 2023

(54) APPARATUS AND METHOD FOR ATOMIC LAYER DEPOSITION

(75) Inventors: Diederik Jan Maas, Breda (NL); Bob van Someren, Rotterdam (NL); Axel Sebastiaan Lexmond, Voorschoten (NL); Carolus Ida Maria Antonius Spee, Helmond (NL); Antonie Ellert Duisterwinkel, Delft (NL); Adrianus Johannes Petrus Maria Vermeer, Geldrop (NL)

(73) Assignee: Nederlandse Organisatie Voor Toegepast-Natuurwetenschappelijk Onderzoek Tno, Delft (NL)

( * ) Notice: Subject to any disclaimer, the term of this patent is extended or adjusted under 35 U.S.C. 154(b) by 0 days.

(21) Appl. No.: 13/060,435

(22) PCT Filed: Aug. 25, 2009

(86) PCT No.: PCT/NL2009/050511
§ 371 (c)(1),
(2), (4) Date: Sep. 19, 2011

(87) PCT Pub. No.: WO2010/024671
PCT Pub. Date: Mar. 4, 2010

(65) Prior Publication Data
US 2012/0003396 A1    Jan. 5, 2012

(30) Foreign Application Priority Data
Aug. 27, 2008   (EP) .................................. 08163090

(51) Int. Cl.
*C23C 16/455*   (2006.01)
*C23C 16/54*    (2006.01)

(52) U.S. Cl.
CPC .. *C23C 16/45551* (2013.01); *C23C 16/45519* (2013.01); *C23C 16/45574* (2013.01); *C23C 16/54* (2013.01); *C23C 16/545* (2013.01)

(58) Field of Classification Search
CPC ........ C23C 16/45551; C23C 16/45519; C23C 16/45574; C23C 16/545; C23C 16/458;
(Continued)

(56) References Cited

U.S. PATENT DOCUMENTS 4,058,430 A * 11/1977 Suntola ............. H01L 21/02631
427/255.13
4,413,022 A * 11/1983 Suntola ............. C23C 16/45544
117/89

(Continued)

FOREIGN PATENT DOCUMENTS

DE   10 2004 015 216 B4   7/2006
EP           2362411 A1 *  8/2011  ............. H01L 21/00
(Continued)

OTHER PUBLICATIONS

Translation of DE 10 2004 015 216 A1.*
Russian Decision on Grant dated Sep. 19, 2014, issued in Russian Application No. 2011111529.

*Primary Examiner* — Jeffrie R Lund

(57) ABSTRACT

Apparatus for atomic layer deposition on a surface of a substrate includes a precursor injector head. The precursor injector head includes a precursor supply and a deposition space that in use is bounded by the precursor injector head and the substrate surface. The precursor injector head is arranged for injecting a precursor gas from the precursor supply into the deposition space for contacting the substrate surface. The apparatus is arranged for relative motion between the deposition space and the substrate in a plane of the substrate surface. The apparatus is provided with a confining structure arranged for confining the injected pre- (Continued)

cursor gas to the deposition space adjacent to the substrate surface.

20 Claims, 13 Drawing Sheets

(58) Field of Classification Search
CPC .............. C23C 16/44; C23C 16/45504; C23C 16/45517; C23C 16/45559; C23C 16/54; C23C 16/4409; C23C 16/455; C23C 16/45576; C23C 16/4583; C23C 16/4585; C23C 16/45502; C23C 16/45525; C23C 16/45527; C23C 16/4582; C23C 16/45544; C23C 16/45548; H01L 21/67069; H01L 21/67784; H01L 21/67017; H01L 21/0228; H01L 21/28556; H01L 21/28562; H01L 21/31604; H01L 21/6838; H01L 21/68735; H01L 21/67309; H01L 21/6734; H01L 21/205
USPC .............. 118/715, 733; 156/345.33, 345.34, 156/345.29
See application file for complete search history.

(56) References Cited

U.S. PATENT DOCUMENTS

| | | | | |
|---|---|---|---|---|
| 4,495,024 | A * | 1/1985 | Bok | G03F 7/16 118/50 |
| 4,587,002 | A * | 5/1986 | Bok | B65G 51/03 118/50.1 |
| 4,628,238 | A * | 12/1986 | Smulders et al. | 318/653 |
| 5,009,932 | A * | 4/1991 | Klett | D06B 19/0094 118/410 |
| 5,057,860 | A * | 10/1991 | Suzuki | G03B 27/32 100/160 |
| 5,422,554 | A * | 6/1995 | Rohde | B25J 15/0616 29/429 |
| 5,443,861 | A | 8/1995 | Huhne | |
| 5,518,550 | A * | 5/1996 | Korenaga | G03F 7/70716 118/500 |
| 5,894,981 | A * | 4/1999 | Kelly | B23K 20/004 228/104 |
| 5,927,605 | A * | 7/1999 | Odajima | G05D 7/005 222/571 |
| 5,997,963 | A | 12/1999 | Davison et al. | |
| 6,170,622 | B1 * | 1/2001 | Wakui | F16F 15/02 188/378 |
| 6,184,596 | B1 * | 2/2001 | Ohzeki | F16C 29/00 310/12.06 |
| 6,200,893 | B1 * | 3/2001 | Sneh | 438/685 |
| 6,406,590 | B1 * | 6/2002 | Ebata | C23C 16/45506 118/723 E |
| 6,447,181 | B1 * | 9/2002 | Hagstrom | B41J 2/325 101/35 |
| 6,451,695 | B2 * | 9/2002 | Sneh | 438/685 |
| 6,475,910 | B1 * | 11/2002 | Sneh | 438/685 |
| 6,555,936 | B1 * | 4/2003 | Tanaka | G03F 7/70716 310/12.06 |
| 6,602,784 | B2 * | 8/2003 | Sneh | 438/680 |
| 6,630,401 | B2 * | 10/2003 | Sneh | 438/680 |
| 6,638,862 | B2 * | 10/2003 | Sneh | 438/685 |
| 6,641,673 | B2 | 11/2003 | Yang | |
| 6,720,680 | B1 * | 4/2004 | Tanaka | G03F 7/70725 310/12.19 |
| 6,744,228 | B1 * | 6/2004 | Cahill | H02K 41/031 318/135 |
| 7,119,874 | B2 * | 10/2006 | Cox | G03F 7/70341 355/30 |
| 7,552,521 | B2 * | 6/2009 | Fink | 29/557 |
| 7,572,686 | B2 * | 8/2009 | Levy et al. | 438/149 |
| 7,850,780 | B2 * | 12/2010 | Levy et al. | 118/715 |
| 8,182,608 | B2 * | 5/2012 | Kerr et al. | 118/719 |
| 8,207,063 | B2 * | 6/2012 | Cowdery-Corvan | C23C 16/545 438/680 |
| 8,261,751 | B2 * | 9/2012 | Kawano | A61B 1/041 128/899 |
| 8,303,713 | B2 * | 11/2012 | Belousov et al. | 118/715 |
| 8,398,770 | B2 * | 3/2013 | Levy et al. | 118/718 |
| 8,420,168 | B2 * | 4/2013 | Kerr et al. | 427/248.1 |
| 8,658,521 | B2 * | 2/2014 | Vermeer | C23C 16/45551 438/507 |
| 8,956,456 | B2 * | 2/2015 | Vermeer | C23C 16/4583 118/719 |
| 9,238,867 | B2 * | 1/2016 | Granneman | C30B 25/14 |
| 9,243,330 | B2 * | 1/2016 | Granneman | C30B 35/005 |
| 9,273,392 | B2 * | 3/2016 | Vermeer | F16C 32/0685 |
| 9,416,449 | B2 * | 8/2016 | De Graaf | C23C 16/04 |
| 9,478,449 | B2 * | 10/2016 | Vermont | C23C 16/54 |
| 9,761,458 | B2 * | 9/2017 | Roozeboom | H01J 37/32623 |
| 10,648,078 | B2 * | 5/2020 | Granneman | C23C 16/54 |
| 10,738,382 | B2 * | 8/2020 | Granneman | C23C 16/45551 |
| 10,837,107 | B2 * | 11/2020 | Granneman | B65G 51/02 |
| 2003/0160115 | A1 * | 8/2003 | Kweon | B05C 5/0212 239/569 |
| 2004/0052972 | A1 | 3/2004 | Schmitt | |
| 2004/0126907 | A1 * | 7/2004 | Korenaga | G03F 7/70758 438/10 |
| 2004/0198200 | A1 * | 10/2004 | Lee | B24B 53/017 451/287 |
| 2007/0218702 | A1 | 9/2007 | Shimizu et al. | |
| 2008/0073829 | A1 * | 3/2008 | McLaughlin | B65H 3/0615 271/225 |
| 2008/0166880 | A1 * | 7/2008 | Levy | C23C 16/45525 438/758 |
| 2008/0166884 | A1 * | 7/2008 | Nelson et al. | 438/765 |
| 2008/0191824 | A1 * | 8/2008 | Yatsu | H01F 7/1615 335/222 |
| 2008/0240804 | A1 * | 10/2008 | Bettiol | G03G 15/2028 399/323 |
| 2008/0315336 | A1 * | 12/2008 | Ravindra | H01L 21/2007 257/421 |
| 2009/0078204 | A1 * | 3/2009 | Kerr et al. | 118/728 |
| 2009/0081366 | A1 * | 3/2009 | Kerr et al. | 427/255.28 |
| 2009/0081374 | A1 * | 3/2009 | Yang | C23C 16/545 427/487 |
| 2009/0081827 | A1 * | 3/2009 | Yang | H01L 21/31616 438/104 |
| 2009/0081842 | A1 * | 3/2009 | Nelson et al. | 438/289 |
| 2009/0081885 | A1 * | 3/2009 | Levy et al. | 438/778 |
| 2009/0081886 | A1 * | 3/2009 | Levy et al. | 438/790 |
| 2009/0165715 | A1 * | 7/2009 | Oh | C23C 16/45551 118/723 R |
| 2009/0217878 | A1 * | 9/2009 | Levy et al. | 118/729 |
| 2009/0236219 | A1 * | 9/2009 | Endo | C23C 14/35 204/192.15 |
| 2009/0273878 | A1 * | 11/2009 | Lee | H01L 21/6831 361/234 |
| 2009/0291209 | A1 * | 11/2009 | Granneman et al. | 427/255.5 |
| 2010/0072414 | A1 * | 3/2010 | Kwon | F16K 99/0019 251/368 |
| 2010/0248423 | A1 * | 9/2010 | Nelson et al. | 438/104 |
| 2010/0255625 | A1 * | 10/2010 | DeVries | C23C 16/4554 438/57 |
| 2010/0316242 | A1 * | 12/2010 | Cohen | H02K 41/03 381/337 |
| 2011/0005066 | A1 * | 1/2011 | Crofoot | B32B 37/003 29/623.5 |
| 2011/0005681 | A1 * | 1/2011 | Savas et al. | 156/345.33 |
| 2011/0005682 | A1 * | 1/2011 | Savas et al. | 156/345.34 |
| 2011/0006040 | A1 * | 1/2011 | Savas et al. | 216/71 |
| 2011/0097494 | A1 * | 4/2011 | Kerr et al. | 427/255.5 |
| 2011/0124199 | A1 * | 5/2011 | Granneman et al. | 438/758 |
| 2011/0268879 | A1 * | 11/2011 | Granneman et al. | 427/255.5 |
| 2012/0003396 | A1 * | 1/2012 | Maas | C23C 16/45551 427/569 |

(56) References Cited

U.S. PATENT DOCUMENTS

| | | | | |
|---|---|---|---|---|
| 2012/0149021 A1* | 6/2012 | Yung | ............ | B03C 1/01 |
| | | | | 435/6.12 |
| 2012/0196050 A1* | 8/2012 | Vermeer | ............ | C23C 16/50 |
| | | | | 427/535 |
| 2012/0291707 A1* | 11/2012 | Granneman | ............ | 118/724 |
| 2013/0012029 A1* | 1/2013 | Vermeer | ............ | C23C 16/0245 |
| | | | | 438/758 |
| 2013/0043212 A1* | 2/2013 | De Graaf | ............ | C23C 16/04 |
| | | | | 216/67 |
| 2013/0052347 A1* | 2/2013 | Kuznetsov et al. | ............ | 427/248.1 |
| 2013/0064977 A1* | 3/2013 | Vermeer | ............ | C23C 16/545 |
| | | | | 427/255.5 |
| 2013/0118895 A1* | 5/2013 | Roozeboom | ............ | C23C 16/0245 |
| | | | | 204/192.34 |
| 2013/0284956 A1* | 10/2013 | Kwon | ............ | F16K 99/0019 |
| | | | | 251/65 |
| 2014/0030445 A1* | 1/2014 | Vermeer | ............ | F16C 32/0685 |
| | | | | 427/569 |
| 2014/0037847 A1* | 2/2014 | Vermeer | ............ | H01L 21/67784 |
| | | | | 427/255.28 |
| 2014/0044887 A1* | 2/2014 | Vermeer | ............ | C23C 16/45551 |
| | | | | 427/535 |
| 2015/0086715 A1* | 3/2015 | Knaapen | ............ | C23C 16/45589 |
| | | | | 427/255.7 |
| 2015/0086729 A1* | 3/2015 | Gortzen | ............ | C23C 16/45536 |
| | | | | 427/576 |
| 2015/0167167 A1* | 6/2015 | Vermeer | ............ | C23C 16/54 |
| | | | | 427/535 |
| 2015/0212625 A1* | 7/2015 | Sakamoto | ............ | G06F 3/03545 |
| | | | | 345/174 |
| 2016/0102399 A1* | 4/2016 | Granneman | ............ | C30B 25/14 |
| | | | | 118/729 |
| 2016/0122874 A1* | 5/2016 | Vermeer | ............ | C23C 16/45574 |
| | | | | 118/715 |

FOREIGN PATENT DOCUMENTS

| | | |
|---|---|---|
| JP | 2005-171272 A * | 6/2005 |
| RU | 2 041 164 C1 | 8/1995 |
| RU | 2291223 C2 | 1/2007 |
| SU | 772601 | 10/1980 |
| WO | 2001/83852 A1 | 11/2001 |
| WO | 2007/106076 A2 | 9/2007 |
| WO | 2008/027215 A2 | 3/2008 |
| WO | 2008/085474 A2 | 7/2008 |

* cited by examiner

APPARATUS AND METHOD FOR ATOMIC LAYER DEPOSITION

The invention relates to an apparatus for atomic layer deposition on a surface of a substrate. The invention further relates to a method for atomic layer deposition on a surface of a substrate.

Atomic layer deposition is known as a method for depositing a monolayer of target material. Atomic layer deposition differs from for example chemical vapour deposition in that atomic layer deposition takes at least two process steps. A first one of these process steps comprises application of a precursor gas on the substrate surface. A second one of these process steps comprises reaction of the precursor material in order to form the monolayer of target material. Atomic layer deposition has the advantage of enabling a good layer thickness control. Known methods of atomic layer deposition however show a rather inefficient use of the precursor gas. Typically, more than half of the precursor gas is wasted. This is problematic, as usually the precursor gas is very costly.

It is an object of the invention to provide an apparatus and method for atomic layer deposition with improved use of the precursor gas.

Accordingly, the invention provides an apparatus for atomic layer deposition on a surface of a substrate, the apparatus including a precursor injector head, the precursor injector head comprising a precursor supply and a deposition space that in use is bounded by the precursor injector head and the substrate surface, wherein the precursor injector head is arranged for injecting a precursor gas from the precursor supply into the deposition space for contacting the substrate surface, wherein the apparatus is arranged for relative motion between the deposition space and the substrate in a plane of the substrate surface, and wherein the apparatus is provided with a confining structure arranged for confining the injected precursor gas to the deposition space adjacent to the substrate surface. In this way, the injected precursor gas can be confined to the deposition space adjacent to the substrate surface. Such confining reduces a used amount of the precursor gas. Confining the precursor gas to the deposition space adjacent to the substrate surface also reduces contamination of the apparatus as a result of unwanted precursor deposits on the apparatus and/or on a backside of the substrate opposite to the substrate surface. This prevents cleaning steps for removing the contamination.

The precursor gas being confined to the deposition space adjacent to the substrate surface, preferably means that the precursor gas is confined within a confining distance of the substrate surface. The confining distance is for example at most one of a maximum dimension and a minimum dimension of the substrate surface, but can also be a thickness of the substrate. Such a dimension may be a diameter or a width of the substrate surface. Alternatively, the confining distance is for example at most a fraction of one of the maximum dimension and the minimum dimension, the fraction for example being equal to 0.1, 0.2, 0.3, 0.5, or 0.8. Alternatively, the confining distance is for example larger than, for example at most 1.2, 1.5, 1.8, 2, 2.5, 3, or 10 times larger than, one of the maximum dimension and the minimum dimension. Alternatively or additionally, the precursor gas being confined to the deposition space adjacent to the substrate surface may mean that the precursor gas is confined in a substantially elongated, for example planar, space along the plane of the substrate surface. Herein, the substrate surface may include a planar extension of this surface in a substrate table or other substrate support means, so that the head is free to move over the edges over the substrate. Alternatively or additionally, the precursor gas being confined to the deposition space adjacent to the substrate surface may mean that the precursor gas, in use, does not pass through an imaginary plane along the substrate surface. Alternatively or additionally, the precursor gas being confined to the deposition space adjacent to the substrate surface may mean that the deposition space does not extent away from the substrate in a direction along the plane of the substrate surface.

Confining the precursor gas to the deposition space enables control of a pressure in the deposition space, for example a precursor gas pressure in the deposition space or a total pressure in the deposition space. Thereto the apparatus may include a deposition space pressure controller. The pressure in the deposition space may be controlled to be independent of, and/or different from, a pressure outside the deposition space. In this way, a predetermined pressure in the deposition space can be set, preferably dedicated to optimizing the atomic-layer deposition process.

In use of the apparatus, the deposition space is bounded by the substrate surface. It may be clear that in this way the substrate helps confining the precursor gas. Preferably, such confining by the substrate ensures that precursor gas flow through the imaginary plane along the substrate surface is substantially prevented.

A combination of relative motion between the deposition space and the substrate in the plane of the substrate surface, and confining the injected precursor gas to the deposition space, further enables a rather efficient use of the precursor gas. In this way, a volume of the precursor gas can be distributed efficiently over the substrate surface, thus enhancing a probability of a precursor gas molecule to attach to the substrate surface after it is injected in the deposition space.

The apparatus is arranged for relative motion between the deposition space and the substrate in the plane of the substrate surface. In an embodiment, the deposition space in use is motionless in the plane of the substrate surface while the substrate is in motion. In another embodiment, the deposition space in use is in motion in the plane of the substrate surface while the substrate is motionless. In yet another embodiment, both the deposition space and the substrate in use are in motion in the plane of the substrate surface.

It may be clear that the confining structure may be formed by one or more projecting portions of the precursor injector head.

In an embodiment, in use the deposition space is bounded by, preferably only, the precursor injector head, the confining structure, and the substrate surface. This further enhances efficiency of use of the precursor gas.

US 2007/0218702 describes a semiconductor processing apparatus with rotating susceptor for atomic layer deposition. US 2007/0218702 has the objective of solving the problem of long purge times in atomic layer deposition and does not address the problem of inefficient use of the precursor gas. In the semiconductor processing apparatus of US 2007/0218702, the precursor gas fills a relatively large space around the susceptor that carries a semiconductor substrate. The semiconductor processing apparatus is arranged for exhausting the precursor gas far away from the semiconductor substrate. Also, exhaust and injection take place at different sides of the semiconductor substrate. As a result, the precursor gas is not confined adjacent to the semiconductor substrate surface in use of the semiconductor processing apparatus of US 2007/0218702.

In an embodiment, the apparatus is further arranged for relative motion between the precursor injector head and the substrate in a plane out of the substrate surface, the precursor injector head further comprising a gas injector for injecting a gas between the precursor injector head and the substrate surface, the gas thus forming a gas-bearing layer. Alternatively or additionally, the gas injector is suitable for injecting the gas between the precursor injector head and a substrate holder that is mechanically attached to the substrate, the gas thus forming the gas-bearing layer.

The movement in the plane out of the substrate surface helps confining the injected precursor gas. The gas-bearing layer allows the precursor injector head to approach the substrate surface and/or the substrate holder closely, for example within 50 micrometer or within 15 micrometer, for example in a range from 3 to 10 micrometer, for example 5 micrometer. Such a close approach of the precursor injector head to the substrate surface and/or the substrate holder enables confinement of the precursor gas to the deposition space, as escape of the precursor gas out of the deposition space is difficult because of the close approach. The substrate surface in use bounding the deposition space may enable the close approach of the precursor injector head to the substrate surface. Preferably, the substrate surface, in use, is free of mechanical contact with the precursor injector head. Such contact could easily damage the substrate.

Optionally, the precursor supply forms the gas injector. However, in an embodiment, the gas injector is formed by a bearing-gas injector for creating the gas-bearing layer, the bearing-gas injector being separate from the precursor supply. Having such a separate injector for the bearing gas enables control of a pressure in the gas-bearing layer separate from other gas pressures, for example the precursor gas pressure in the deposition space. For example, in use the precursor gas pressure can be lower than the pressure in the gas-bearing layer. Optionally, the precursor gas pressure is below atmospheric pressure, for example in a range from 0.01 to 100 millibar, optionally in a range from 0.1 to 1 millibar. Numerical simulations performed by the inventors show that in the latter range, a fast deposition process may be obtained. A deposition time may typically be 10 microseconds for flat substrates and 20 milliseconds for trenched substrates, for example when chemical kinetics are relatively fast. The total gas pressure in the deposition space may typically be 10 millibar. The precursor gas pressure may be chosen based on properties of the precursor, for example a volatility of the precursor. The precursor gas pressure being below atmospheric pressure, especially in the range from 0.01 to 100 millibar, enables use of a wide range of precursors, especially precursors with a wide range of volatilities.

The gas-bearing layer in use typically shows a strong increase of the pressure in the gas-bearing layer as a result of the close approach of the precursor injector head towards the substrate surface. For example, in use the pressure in the gas-bearing layer at least doubles, for example typically increases eight times, when the precursor injector head moves two times closer to the substrate, for example from a position of 50 micrometer from the substrate surface to a position of 25 micrometer from the substrate surface, ceteris paribus. Preferably, a stiffness of the gas-bearing layer in use is between $10^3$ and $10^{10}$ Newton per millimeter, but can also be outside this range.

In an embodiment, the apparatus is arranged for applying a prestressing force on the precursor injector head directed towards the substrate surface. The gas injector may be arranged for counteracting the prestressing force by controlling the pressure in the gas-bearing layer. In use, the prestressing force increases a stiffness of the gas-bearing layer. Such an increased stiffness reduces unwanted movement out of the plane of the substrate surface. As a result, the precursor injector head can be operated more closely to the substrate surface, without touching the substrate surface.

In an embodiment, the precursor injector head is provided with the projecting portions, wherein, in use, the gas-bearing layer is formed between the projecting portions and the substrate, and/or is formed between the projecting portions and a substrate holder surface of the substrate holder. As a result, a thickness of the gas-bearing layer is less than a thickness of the deposition space, measured in a plane out of the substrate surface. Such a precursor injector head is considered to be efficient. Such efficiency follows for example from the possibility to, in this embodiment, better separate the precursor gas from other, possibly reactive, gasses used during atomic layer deposition. As another example of such efficiency, in use this embodiment has, in the deposition space, a distance between the injector head and the substrate that is different from a distance between the injector head and the substrate in the gas-bearing layer. This enables for example a larger residence time of precursor gas molecules in the deposition space, so that a chance for deposition on the substrate is increased. This may lead to a more efficient use of the precursor gas. Calculations and experiments performed by the inventor show that, in this embodiment, the thickness of the gas-bearing layer may be in a range from 3 to 7 micrometer, typically 5 micrometer.

In an embodiment, the projecting portions are provided with a bearing-gas supply and possibly with the bearing-gas injector that may include the bearing-gas supply. In this way, the gas-bearing layer can be formed between the projecting portions and the substrate, and/or between the projecting portions and the substrate holder surface of the substrate holder. Preferably, in use the bearing-gas supply faces the substrate surface and/or the substrate holder surface of the substrate holder.

Preferably, the apparatus includes a gas-bearing layer pressure controller for controlling a bearing gas pressure in the gas-bearing layer, and a prestressing pressure controller arranged for applying the prestressing force by setting a prestressing pressure counteracting the bearing gas pressure.

In an embodiment, the apparatus includes the deposition space pressure controller for controlling a total pressure in the deposition space, and the gas-bearing layer pressure controller for controlling a pressure in the gas-bearing layer, wherein the gas-injector is formed by a gas-bearing injector that is separate from the precursor supply, wherein the deposition space pressure controller is arranged for applying the prestressing force by setting the total pressure in the deposition space, and wherein the gas-bearing layer pressure controller is arranged for applying the pressure in the gas-bearing layer above the total pressure in the deposition space. The prestressing force may be formed by the total gas pressure in the deposition space being below a pressure in an outer environment of the precursor injector head. This embodiment combines well with the advantageous values for the precursor gas pressure and the total gas pressure in the deposition space, as identified in the numerical simulations performed by the inventors. Alternatively or additionally, the prestressing force may be formed magnetically, and/or gravitationally by adding a weight to the precursor injector head for creating the prestressing force. Alternatively or additionally, the prestressing force may be formed by a spring or another elastic element. Alternatively or additionally, the prestressing force may be applied by forming, separate from the pressure in the deposition space, in between the precursor injector head and the substrate a gas pressure that is below the pressure in the outer environment of the precursor injector head, for example a vacuum. Accordingly, the prestressing pressure can be applied for providing the prestressing force by setting the prestressing pressure counteracting the bearing gas pressure.

In an embodiment, the precursor supply is arranged for flow of the precursor gas in a direction transverse to a longitudinal direction of the deposition space. In an embodiment, the precursor supply is formed by at least one precursor supply slit, wherein the longitudinal direction of the deposition space is directed along the at least one precursor supply slit. Preferably, the precursor injector head is arranged for flow of the precursor gas in a direction transverse to a longitudinal direction of the at least one precursor supply slit. This enables a concentration of the precursor gas to be substantially constant along the supply slit, as no concentration gradient can be established as a result of adhesion of the precursor gas to the substrate surface. The concentration of the precursor gas is preferably chosen slightly above a minimum concentration needed for atomic layer deposition. This adds to efficient use of the precursor gas. Preferably, the relative motion between the deposition space and the substrate in the plane of the substrate surface, is transverse to the longitudinal direction of the at least one precursor supply slit.

In an embodiment, the confining structure is formed by a flow barrier for the precursor gas along an outer flow path arranged, in use, between the precursor injector head and the substrate surface to the outer environment, for substantially impeding a volumetric flow rate of the precursor gas along the outer flow path compared to a volumetric flow rate of the injected precursor gas. Preferably, the flow barrier is obtained by the close approach of the precursor injector head to the substrate surface and/or the substrate holder, which is enabled by the gas-bearing layer. Although variants of the confining structure are not limited to the flow barrier, the flow barrier forms an efficient variant of the confining structure. The outer environment may be an environment outside the precursor injector head where a boundary of the precursor injector head deviates away from the plane of the substrate surface, but can also be located between the precursor injector head and the plane of the substrate, outside the deposition space.

In use of this embodiment, the flow barrier substantially impedes the volumetric flow rate of the precursor gas along the outer flow path compared to the volumetric flow rate of the injected precursor gas. Such impeding may substantially lower a volumetric flow rate of the precursor gas along the outer flow path compared to the volumetric flow rate of the injected precursor gas, for example during filling of the deposition space with the precursor gas. In addition, the impeding enables the possibility to operate the apparatus with an elevated precursor gas pressure and/or an elevated total gas pressure in the deposition space during steady state operation after filling. Such elevated gas pressures may for example be in a range from 1.2 to 20 bar, in particular in a range from 3 to 8 bar. A stronger flow barrier in general leads to higher elevated pressures. An elevated precursor gas pressure increases a deposition speed of the precursor gas on the substrate surface. As deposition of the precursor gas often forms an important speed-limiting process step of atomic layer deposition, this embodiment allows increasing of the speed of atomic layer deposition. Speed of the process is important, for example in case the apparatus is used for building a structure that includes a plurality of atomic layers, which can occur often in practice. Increasing of the speed increases a maximum layer thickness of a structure that can be applied by atomic layer deposition in a cost-effective way, for example from 10 nanometer to values above 10 nanometer, for example in a range from 20 to 50 nanometer or even typically 100 nanometer. The apparatus will thus enable new applications of atomic layer deposition.

In an embodiment, the gas-bearing layer forms the confining structure, in particular the flow barrier. In this embodiment, the outer flow path may at least partly lead through the gas-bearing layer. As the gas-bearing layer forms a rather effective version of the confining structure and/or the flow barrier, loss of the precursor gas via the outer flow path may be prevented.

In an embodiment, the flow barrier is formed by a confining gas curtain and/or a confining gas pressure in the outer flow path. These form reliable and versatile options for forming the flow barrier. Gas that forms the confining gas curtain and/or pressure may as well form at least part of the gas-bearing layer. Alternatively or additionally, the flow barrier is formed by a fluidic structure that is attached to the precursor injector head. Preferably, such a fluidic structure is made of a fluid that can sustain temperatures up to one of 80° C., 200° C., 400° C., and 600° C. Such fluids as such are known to the skilled person.

In an embodiment, the flow barrier is formed by a flow gap between the precursor injector head and the substrate surface and/or between the precursor injector head and a surface that extends from the substrate surface in the plane of the substrate surface, wherein a thickness and length of the flow gap along the outer flow path are adapted for substantially impeding the volumetric flow rate of the precursor gas along the outer flow path compared to the volumetric flow rate of the injected precursor gas. Preferably, such a flow gap at the same time forms, at least part of, the outer flow path. Preferably, a thickness of the flow gap is determined by the gas-bearing layer. Although in this embodiment a small amount of the precursor gas may flow out of the deposition space along the outer flow path, it enables a rather uncomplicated yet effective option for forming the flow barrier.

In an embodiment, the deposition space has an elongated shape in the plane of the substrate surface. A dimension of the deposition space transverse to the substrate surface may be significantly, for example at least 5 times or at least 50 times, smaller than one or more dimensions of the deposition space in the plane of the substrate surface. The elongated shape can be planar or curved. Such an elongated shape diminishes a volume of the precursor gas that needs to be injected in the deposition space, thus enhancing the efficiency of the injected gas. It also enables a shorter time for filling and emptying the deposition space, thus increasing the speed of the overall atomic layer deposition process.

In an embodiment, the deposition space of the apparatus is formed by a deposition gap between the substrate surface and the precursor injector head, preferably having a minimum thickness smaller than 50 micrometer, more preferably smaller than 15 micrometer, for example around 3 micrometer. The flow gap may have similar dimensions. A deposition space having a minimum thickness smaller than 50 micrometer enables a rather narrow gap leading to a rather efficient use of the precursor gas, while at the same time avoiding emposing stringent conditions on deviations in a plane out of the substrate surface of the positioning system that establishes the relative motion between the deposition space and the substrate in the plane of the substrate surface. In this way the positioning system can be less costly. A minimum thickness of the deposition gap smaller than 15 micrometer further enhances efficient use of the precursor gas.

The gas-bearing layer enables the flow gap and/or the deposition gap to be relatively small, for example having its minimum thickness smaller than 50 micrometer or smaller than 15 micrometer, for example around 10 micrometer, or even close to 3 micrometer.

In an embodiment, the precursor injector head further comprises a precursor drain and is arranged for injecting the precursor gas from the precursor supply via the deposition space to the precursor drain. The presence of the precursor drain offers the possibility of continuous flow through the deposition space. In continuous flow, high-speed valves for regulating flow of the precursor gas may be omitted. Preferably, a distance from the precursor drain to the precursor supply is fixed during use of the apparatus. Preferably, in use the precursor drain and the precursor supply are both facing the substrate surface. The precursor drain and/or the precursor supply may be formed by respectively a precursor drain opening and/or a precursor supply opening.

In an embodiment, the apparatus has from the precursor drain a drain flow path, wherein in use the flow barrier and a flow resistance and/or a gas pressure along the drain flow path are arranged for substantially facilitating a volumetric flow rate of the precursor gas along the drain flow path compared to a volumetric flow rate of the precursor gas along the outer flow path. This reduces loss of the precursor gas to the outer environment. The precursor gas that flows out of the deposition space through the drain may be collected and reused.

In an embodiment, the apparatus is arranged for providing at least one of a reactant gas, for example an oxidizer gas, a plasma, laser-generated radiation, and ultraviolet radiation in a reaction space for reacting, for example oxidizing, the precursor with the reactant gas after deposition of the precursor gas on at least part of the substrate surface in order to obtain the atomic layer on the at least part of the substrate surface. The reaction space may coincide with the deposition space, but preferably is separate from the deposition space. Such a separate reaction space enables a well-controlled reaction of the deposited precursor and prevents the formation of unwanted particles in the deposition space formed by reacted precursor gas.

It is noted that using the plasma for reacting the deposited precursor enables reacting at a relatively low temperature. This can be important for plastic, possibly flexible, substrates. In addition, the plasma can be generated at a relatively wide range of pressures. As a result, using the plasma for reacting the deposited precursor increases a process window of the apparatus. For example, the pressure in the gas-bearing layer and/or the precursor gas pressure in the deposition space can be chosen from a larger pressure range. This can be understood for example when it is realised that all of a pressure of the plasma, the precursor gas pressure, and the pressure in the gas-bearing layer, may influence the approach of the precursor injector to the substrate surface and/or the substrate holder. Therefore, an embodiment wherein the apparatus is arranged for providing the plasma in the reaction space for reacting, for example oxidizing, the precursor with the reactant gas after deposition of the precursor gas on at least part of the substrate surface in order to obtain the atomic layer on the at least part of the substrate surface, combines well with an embodiment wherein the apparatus is further arranged for relative motion between the precursor injector head and the substrate in a plane out of the substrate surface, the precursor injector head further comprising a gas injector for injecting a gas between the precursor injector head and the substrate surface, the gas thus forming a gas-bearing layer.

According to a first aspect of the invention, there is provided an apparatus for atomic layer deposition on a surface of a substrate, the apparatus including a precursor injector head, the precursor injector head comprising a precursor supply and a deposition space that in use is bounded by the precursor injector head and the substrate surface, wherein the precursor injector head is arranged for injecting a precursor gas from the precursor supply into the deposition space for contacting the substrate surface, wherein the apparatus is arranged for relative motion between the deposition space and the substrate in a plane of the substrate surface, wherein the apparatus is arranged for providing a plasma in a reaction space for reacting, for example oxidizing, the precursor with the reactant gas after deposition of the precursor gas on a part of the substrate surface in order to obtain the atomic layer on the part of the substrate surface. The apparatus according to this first aspect preferably comprises the reaction space. It can be used for providing the plasma in the reaction space for reacting the precursor with the reactant gas after deposition of the precursor gas on the part of the substrate surface in order to obtain the atomic layer on the part of the substrate surface. In this way the atomic layer can be formed in a controlled way by using the apparatus. More specifically the apparatus according to this first aspect enables an elegant way of atomic layer deposition on the substrate. More in particular, it may be clear that, because of the relative motion between the reaction space and the substrate, and because only part of the surface is reacted at one moment, a rather uniformly deposited layer can be obtained. In this way common problems with plasma's that are non-uniform over the substrate surface, can be largely prevented. It is further noted that, according to this first aspect, the confining structure may be omitted, although it may be present. It may further be clear that, preferably, the reaction space in use is bounded by the precursor injector head and the substrate surface. With respect to the prior art it is noted that any known device for atomic layer deposition having a reaction space and being arranged for providing to the reaction space a reaction gas via a diffusor, such as a porous material, cannot be used for providing a plasma to the reaction space, as the diffusor will significantly decrease a quality of the plasma, such as a reactivity of the plasma, for example a reactivity of an afterglow of the plasma. To overcome this problem, more in general, the apparatus is preferably provided with a reactant supply that is substantially free of obstructions for the plasma injected via the reactant supply. Such obstructions may react with the plasma. In this way, the plasma can be provided in the reaction space in a continuous volume of the plasma.

Embodiments discussed below or above may relate to the apparatus provided with the confining structure according to the invention, and may relate to the apparatus according to the first aspect.

In an embodiment, the apparatus is provided with an atomic layer deposition head that includes the precursor supply, the reactant supply, the deposition space and the reaction space, the apparatus being arranged for relative motion between the atomic layer deposition head and the substrate in the plane of the substrate surface. Such an atomic layer deposition head integrates application and reaction, for example oxidation or hydrogenation, of the precursor. Relative motion between the deposition space and the substrate can, in this embodiment, be established by relative motion between the atomic layer deposition head and the substrate.

In an embodiment, the apparatus is arranged for providing a buffer gas curtain adjacent to the deposition space, wherein the buffer gas is substantially inert with respect to the precursor gas, and a magnitude of a flow rate, a flow direction, and a position of the buffer gas curtain is arranged for substantially preventing mixing of the precursor gas with other gasses than the buffer gas. Such a buffer gas curtain helps preventing formation of undesired particles that may deposit on the substrate surface. Preferably the buffer gas curtain is arranged for forming the confining structure. Gas that forms the buffer gas curtain may as well form at least part of the gas-bearing layer.

In an embodiment, the precursor drain is formed by at least one precursor drain slit. The at least one precursor drain slit and/or the at least one precursor supply slit may comprise a plurality of openings, or may comprise at least one slot. Using slits enables efficient atomic layer deposition on a relatively large substrate surface, or simultaneous atomic layer deposition on a plurality of substrates, thus increasing productivity of the apparatus. Preferably, a distance from the at least one precursor drain slit to the at least one precursor supply slit is significantly smaller, for example more than five times smaller, than a length of the precursor supply slit and/or the precursor drain slit. This helps the concentration of the precursor gas to be substantially constant along the deposition space.

In an embodiment, the apparatus is arranged for relative motion between the deposition space and the substrate in the plane of the substrate surface, by including a reel-to-reel system arranged for moving the substrate in the plane of the substrate surface. This embodiment does justice to a general advantage of the apparatus, being that a closed housing around the precursor injector head for creating vacuum therein, and optionally also a load lock for entering the substrate into the closed housing without breaking the vacuum therein, may be omitted. The reel-to-reel system preferably forms the positioning system.

Preferably, the precursor injector head is provided with the projecting portions, wherein, in use, the gas-bearing layer is formed between the projecting portions and the substrate, and/or a substrate holder surface of a substrate holder. Preferably, a width of one of the projecting portions is in a range from 1 to 30 millimeter.

In an embodiment, the thickness of the gas-bearing layer is less than the thickness of the deposition space, measured in a plane out of the substrate surface.

In an embodiment, the thickness of the gas-bearing layer is in a range from 3 to 15 micrometer, and/or the thickness of the deposition space out of the plane of the substrate is in a range from 3 to 100 micrometer.

Preferably, the precursor supply is formed by a slit having an undulated shape.

In an embodiment, the substrate is a fragile or flexible substrate.

In an embodiment, the substrate is, in use, not supported near the precursor injector head.

In an embodiment, the apparatus is arranged for providing the plasma in the reaction space for reacting, for example oxidizing, the precursor with the reactant gas after deposition of the precursor gas on at least part of the substrate surface in order to obtain the atomic layer on the at least part of the substrate surface.

According to a second aspect of the invention, there is provided an apparatus for atomic layer deposition on a surface of a substrate, the apparatus including a precursor injector head, the precursor injector head comprising a precursor supply and a deposition space that in use is bounded by the precursor injector head and the substrate surface, wherein the precursor injector head is arranged for injecting a precursor gas from the precursor supply into the deposition space for contacting the substrate surface, wherein the apparatus is arranged for relative motion between the deposition space and the substrate in a plane of the substrate surface, wherein the precursor supply is formed by a slit having an undulated shape. Such a shape allows for optimization of a pressure distribution on the substrate surface. Such optimization can be important for fragile or flexible substrates, especially if such substrates are not supported near the precursor injector head. For example, by using the undulated slit, a pressure pattern on a flexible substrate that would promote the flexible substrate to deform according to one of its natural modes, can be prevented. Using straight slits therefore may more easily lead to deformations in the flexible substrate. It may be clear that the apparatus according to the second aspect of the invention, may be combined with one or more of the embodiment described above or below.

The invention further provides a method for atomic layer deposition on a surface of a substrate using an apparatus including a precursor injector head, the precursor injector head comprising a precursor supply and a deposition space, wherein the deposition space in use is bounded by the precursor injector head and the substrate surface, comprising the steps of: a) injecting a precursor gas from the precursor supply into the deposition space for contacting the substrate surface; b) establishing relative motion between the deposition space and the substrate in a plane of the substrate surface; and c) confining the injected precursor gas to the deposition space adjacent to the substrate surface, to provide a deposition space that in use is bounded by the precursor injector head and the substrate surface. This method leads to a relatively efficient use of the precursor gas.

In an embodiment, the apparatus comprises a reaction space, the method comprising the step of: d) providing at least one of a reactant gas, a plasma, laser-generated radiation, and ultraviolet radiation, in the reaction space for reacting the precursor with the reactant gas after deposition of the precursor gas on at least part of the substrate surface in order to obtain the atomic layer on the at least part of the substrate surface. In this way the atomic layer can be formed in a controlled way by using the apparatus.

In an embodiment, the method includes providing a gas-bearing layer in a gap between the precursor injector head and the substrate surface. This enables reaching a relatively small, for example smaller than 15 micrometer, gap between the precursor injector head and the substrate surface.

The invention will now be described, in a non-limiting way, with reference to the accompanying drawings, in which.

Unless stated otherwise, the same reference numbers refer to like components throughout the drawings.

Figure 1A:
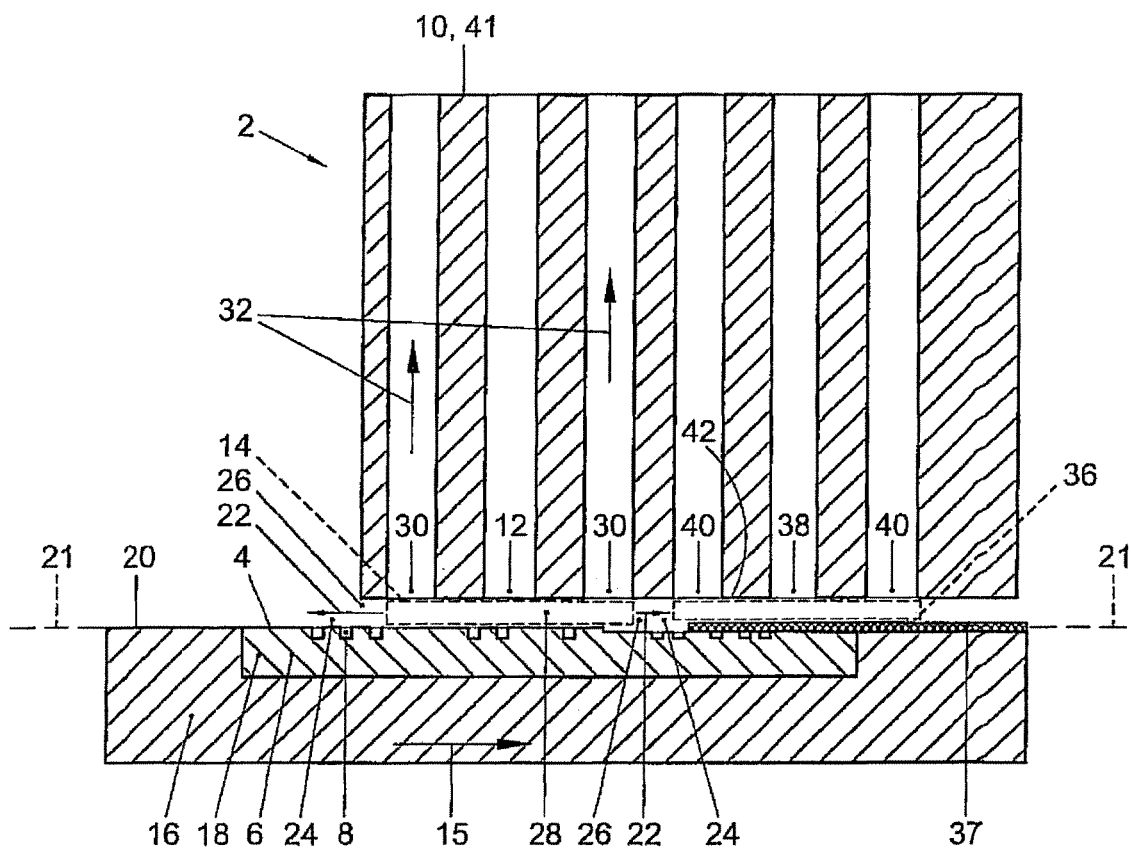
FIG. 1A shows an apparatus, in a first embodiment according to the invention, for atomic layer deposition on a surface of a substrate.

FIG. 1A shows an apparatus 2, in a first embodiment according to the invention, for atomic layer deposition on a surface 4 of a substrate 6. The surface 4 may include trenches 8, in particular in case the substrate 6 is used for making DRAM chips, although the trenches may be absent as well. The trenches 8 for example have a depth between 5 and 15 micrometer and a width between 100 and 300 nanometer, for example 200 nm. Typically, a trench density may be $10^{12}$ trenches per square meter. A surface multiplication factor that typically is in a range from five to ten, may be achieved by the trenches. The substrate 6 is for example a semiconductor substrate made of silicon or another semiconductor material. The apparatus 2 includes a precursor injector head 10. The precursor injector head 10 comprises a precursor supply 12 and a deposition space 14. The deposition space 14 is in use bounded by the precursor injector head 10 and the substrate surface 4.

The precursor injector head 10 is arranged for injecting a precursor gas from the precursor supply 12 into the deposition space 14 for contacting the substrate surface 4. The precursor gas can for example contain Hafnium Chloride ($HfCl_4$), but can also contain another type of precursor material, for example Tetrakis-(Ethyl-Methyl-Amino) Hafnium or trimethylaluminium ($Al(CH_3)_3$). The precursor gas can be injected together with a carrier gas, such as nitrogen gas or argon gas. A concentration of the precursor gas in the carrier gas may typically be in a range from 0.01 to 1 volume %. In use, a precursor gas pressure in the deposition space 14 may typically be in a range from 0.1 to 1 millibar, but can also be near atmospheric pressure, or even be significantly above atmospheric pressure. The precursor injector head may be provided with a heater for establishing an elevated temperature in the deposition space 14, for example near 220° C.

The apparatus 2 is arranged for relative motion between the deposition space 14 and the substrate 6 in a plane of the substrate surface 4. The apparatus 2 may be arranged for relative motion between the precursor supply 12 and the substrate 6 in the plane of the substrate surface 4. For relative motion in the plane of the substrate surface, the apparatus in general may include a positioning system that is arranged for moving at least one of the deposition space and the substrate with respect to the other one of the deposition space and the substrate, in translational motion and/or rotational motion. An example of the positioning system and various examples of the relative motion in the plane of the substrate will be illustrated with reference to FIGS. 9A, 9B, 9C, and/or 10. In the first embodiment, the precursor injector head 10 in use is substantially motionless in the plane of the substrate surface 4, while the positioning system is arranged for moving the substrate 6, in a direction indicated by an arrow 15. For applying stacked layers, the positioning system may be arranged for moving the substrate 6 back in an opposite direction of the arrow 15. It is clear however that in other embodiments the apparatus may lack the positioning system.

In general, the positioning system may include a substrate holder 16 for the substrate 6 that is arranged for holding the substrate 6. The substrate holder 16 may be moving with the substrate, as indicated in FIG. 1A. In this case, the positioning system may be arranged for moving at least one of the precursor supply 12 and the substrate holder 16 with respect to the other one of the precursor supply 12 and the substrate holder 16. In the first embodiment, the substrate holder 16 may be provided with a recess 18 for taking up the substrate 6. A substrate holder surface 20 of the substrate holder 16 may be flush, within several micrometers, with the substrate surface 4. Alternatively, the substrate surface 4 may be recessed with respect to the substrate holder surface 20.

The apparatus 2 in the first embodiment is provided with a confining structure arranged for confining the injected precursor gas to the deposition space 14 adjacent to the substrate surface 4. In use, the precursor gas may not pass an imaginary plane 21 along the substrate surface 4 and the substrate holder surface 20. The confining structure may be formed by a flow barrier for the precursor gas along an outer flow path. The outer flow path in this example is indicated by arrows 22. The outer flow path 22 is arranged, in use, between the precursor injector head 10 and the substrate surface 4 to an outer environment 24, for example located outside the deposition space 14 and/or outside the precursor injector head 10. Alternatively or additionally, the outer flow path 22 is arranged, in use, between the precursor injector head 10 and the substrate holder surface 20 that extends from the substrate surface 4 in the plane of the substrate surface 4. In this example, the flow barrier is formed by a flow gap 26 between the precursor injector head 10 and the substrate surface 4. Alternatively or additionally, the flow barrier is formed by the precursor injector head 10 and the substrate holder surface 20 that extends from the substrate surface 4 in the plane of the substrate surface 4. In this way a volumetric flow rate of the precursor gas along the outer flow path 22 can be substantially impeded compared to a volumetric flow rate of the injected precursor gas through the precursor supply 12, for example during filling of the deposition space 14, or during steady-state operation. The precursor gas pressure in the deposition space 14 that can be achieved in this way, increases deposition speed of the precursor gas on the substrate surface. Although this forms a general advantage, it is in particular valuable for atomic layer deposition inside the trenches 8, as deposition inside such trenches takes more time than deposition on a completely flat substrate.

A thickness and length of the flow gap 26 along the outer flow path may be adapted for substantially impeding the volumetric flow rate of the precursor gas along the outer flow path compared to the volumetric flow rate of the injected precursor gas. A typical thickness of the flow gap is in a range from 3 to 50 micrometer, preferably smaller than 15 micrometer.

In use the deposition space 14 may have an elongated shape in the plane of the substrate surface 4. This may mean that an extent of the deposition space 14 in a direction transverse to the substrate surface is significantly, for example at least 10 times or at least 100 times, smaller than the extent of the deposition space 14 in the plane of the substrate surface. In use the deposition space of the apparatus may be formed by a deposition gap 28 between the substrate surface 4 and the precursor injector head 10. The deposition gap preferably has a minimum thickness smaller than 50 micrometer, more preferably smaller than 15 micrometer.

Such values of the flow gap and/or the deposition gap can be achieved by formation of a gas-bearing layer, further illustrated with reference to FIGS. 4-8.

In general, a size of the deposition space 14 along the substrate surface in a direction of the relative motion, this direction in the first embodiment being indicated by the arrow 15, may in use be substantially smaller than a size of the substrate surface 4 in the direction of the relative motion in the plane of the substrate surface 4. The size of the deposition space can for example be at least two, five, and/or ten times smaller than the size of the substrate. This enables deposition of the precursor gas on separate areas on the substrate surface.

In the apparatus 2 in the first embodiment, the precursor injector head 10 further comprises a precursor drain 30, in this example two precursor drains 30. The precursor injector head 10 may be arranged for injecting the precursor gas from the precursor supply 12 via the deposition space 14 to the precursor drains 30. The apparatus may have from the precursor drains a drain flow path, indicated by arrow 32, in this example two drain flow paths 32. In use the flow barrier 26 and a flow resistance and/or a gas pressure along the drain flow path 32 are arranged for substantially facilitating a volumetric flow rate of the precursor gas along the drain flow path 32 compared to the volumetric flow rate of the precursor gas along the outer flow path 22. A general advantage of the precursor drain is that it can be used for collecting unused precursor gas for reuse. In addition, the presence of the precursor drain enables better control of flow of the precursor gas out of the deposition space 14. In use, a typical value of the volumetric flow rate of the precursor gas along the outer flow path 22 may be in a range from 500 to 3000 sccm (standard cubic centimeters per minute).

In general, the apparatus 2 may be arranged for providing at least one of a reactant gas, a plasma, laser-generated radiation, and ultraviolet radiation, in a reaction space 36 for reacting the precursor after deposition of the precursor gas on at least part of the substrate surface 4. In this way for example plasma-enhanced atomic laser deposition may be enabled. Plasma-enhanced atomic layer deposition is especially suitable for deposition of low-k Aluminum Oxide ($Al_2O_3$) layers of high quality, for example for manufacturing semiconductor products such as chips and solar cells. The reactant gas contains for example an oxidizer gas such as Oxygen ($O_2$), ozone ($O_3$), and/or water ($H_2O$).

After reacting, an atomic layer 37 on the at least part of the substrate surface 4 can be obtained. In the first embodiment, the precursor injector head 10 is provided with a reactant supply 38. The precursor injector head 10 may be arranged for injecting the reactant gas from the reactant supply 38 into the reaction space 36 for contacting the substrate surface 4. In addition, the precursor injector head 10 further comprises a reactant drain 40, in this example two reactant drains 40. The precursor injector head 10 may be arranged for injecting a precursor gas from the reactant supply 38 via the reaction space 36 to the reactant drains 40.

The precursor injector head 10 thus described forms an example of, possibly a part of, an atomic layer deposition head 41. In this example, the atomic layer deposition head includes the precursor supply 12, the reactant supply 38, the deposition space 14 and the reaction space 36. The apparatus 2 may include the atomic layer deposition head 41, and may be arranged for relative motion between the atomic layer deposition head 41 and the substrate in the plane of the substrate surface.

Figure 1B:
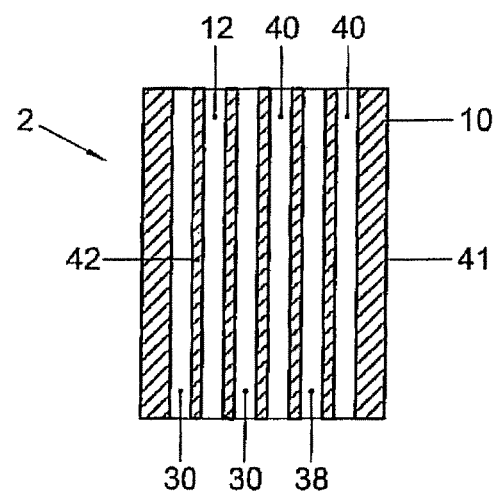
FIG. 1B shows an example of a side of a precursor injector head that faces, in use, a substrate surface.

FIG. 1B shows an example of a side, indicated by reference number 42 in FIG. 1A, of the precursor injector head 10 that faces, in use, the substrate surface 4. FIG. 1B shows the precursor supply 12, the precursor drains 30, the reactant supply 38, and the reactant drains 40. In this example, the precursor supply 12 and the precursor drain 30 are formed by longitudinal slots, which longitudinal slots are examples of respectively a precursor supply slit 12 and a precursor drain slit 30. Alternatively, the precursor supply slit 12 and the precursor drain slit 30 can also have the form of an array of, possibly interconnected, holes. Analogously, in this example the precursor drains 30 and the reactant drains 40 are formed by longitudinal slots.

In an example of a process of atomic layer deposition, various stages can be identified. In a first stage, the substrate surface is exposed to the precursor gas, for example Hafnium Tetra Chloride. Deposition of the precursor gas is usually stopped if the substrate surface 4 is fully occupied by precursor gas molecules. In a second stage, the deposition space 14 is purged using a purge gas, and/or by exhausting the deposition space 14 by using vacuum. In this way, excess precursor molecules can be removed. The purge gas is preferably inert with respect to the precursor gas. In a third stage, the precursor molecules are exposed to the reactant gas, for example an oxidant, for example water vapour ($H_2O$). By reaction of the reactant with the deposited precursor molecules, the atomic layer is formed, for example Hafnium Oxide ($HfO_2$). This material can be used as gate oxide in a new generation of transistors. In a fourth stage, the reaction space 36 is purged in order to remove excess reactant molecules.

The apparatus 2 in the first embodiment is arranged for carrying out the first and third stage. In general it may be clear that, because separate spaces are used for deposition and reaction, these can remain filled during use of the apparatus, for example when a plurality of substrates is provided with an atomic layer or when a multitude of atomic layers is deposited on one or more substrates. In this way, conditions like temperature, precursor gas pressure and/or exposure time of the surface to the precursor gas, may be set more accurately compared to a situation in which one chamber forms both the deposition space and the reaction space. Occurrence of transients in the precursor gas pressure can be reduced. In addition, purging of the deposition space in order to replace the precursor gas by the reactant gas, may be omitted. This significantly improves speed of the atomic layer deposition process.

Figure 1C:
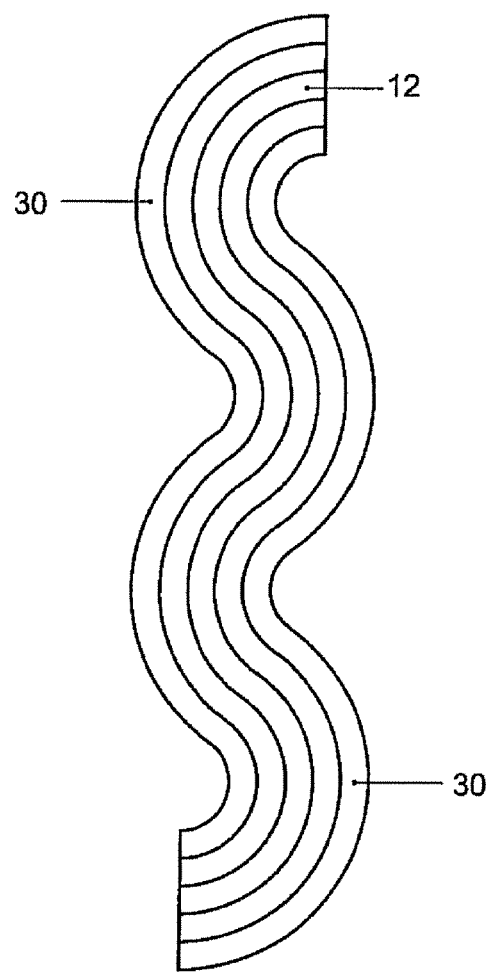
FIGS. 1C and 1D show examples of undulated shapes for a precursor supply slit and a precursor drain slit.
Figure 1D:
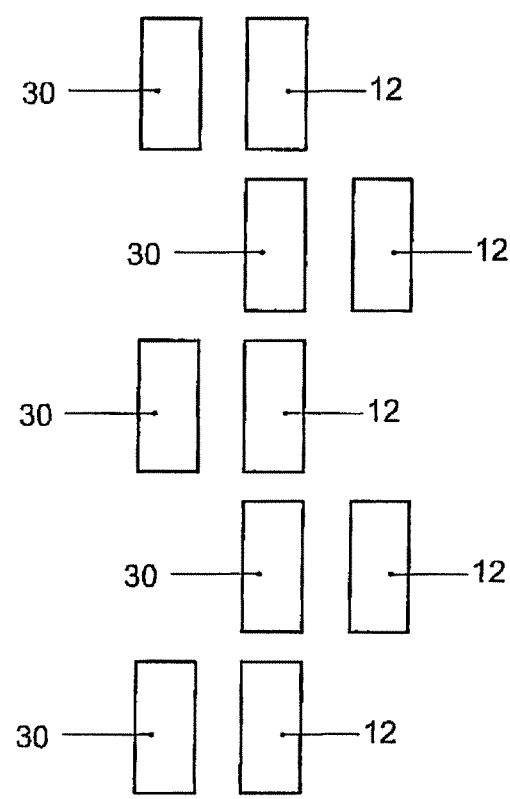

FIG. 1B shows the precursor supply slit 12 and the precursor drain slits 30 having a rather straight shape. However, it may be clear that, in general, one or more of these slits and other slits may have an undulated shape, as an alternative or addition to the rather straight shape. FIGS. 1C and 1D show examples of undulated shapes for the precursor supply slit 12 and the precursor drain slit 30. These variations allow for optimization of a pressure distribution on the substrate surface 4. Such optimization can be important for fragile or flexible substrates, especially if such substrates are not supported near the precursor injector head 10.

Figure 2:
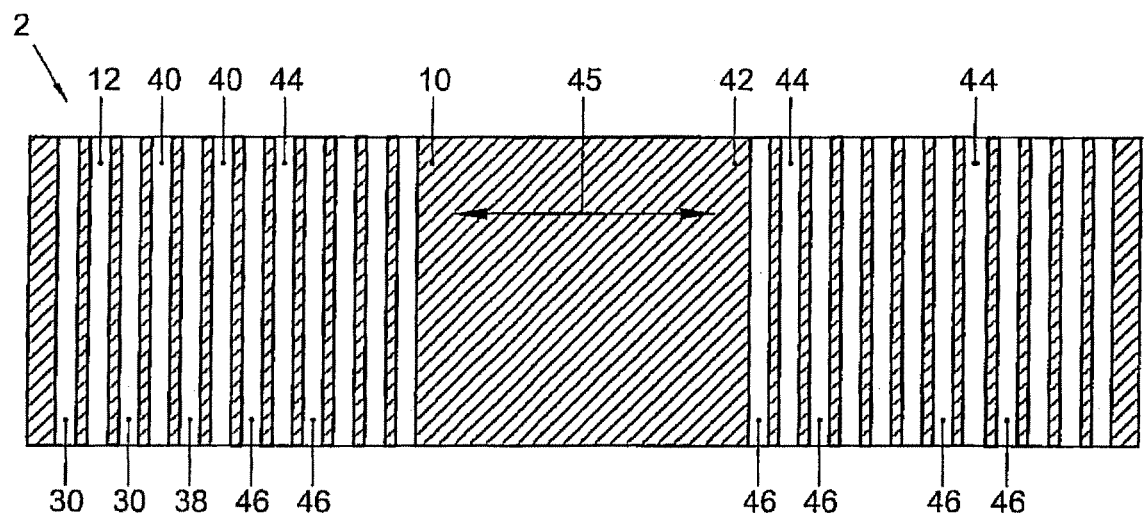
FIG. 2 shows a side of a precursor injector head that, in use, faces a substrate surface.

FIG. 2 shows the side 42 of the precursor injector head 10 that, in use, faces the substrate surface 4, in a second embodiment of the apparatus according to the invention. In the second embodiment, the precursor injector head 10 is provided with the precursor supply 12, the precursor drains 30, the reactant supply 38, and the reactant drains 40. In addition, the precursor injector head 10 in the second embodiment is provided with at least one, in this example N+3, additional precursor supplies 44. From these N+3 additional precursor supplies, three additional precursor supplies are drawn in FIG. 2 while N additional precursor supplies are indicated by the double arrow 45. The additional precursor supplies 44 are similar to the precursor supply 12. N may be equal to any integer number, including zero, for example 1, 5, 10, or 50. Analogously, the precursor injector head 10 may be provided with at least one additional precursor drain 46, and/or at least one additional deposition space, being similar to respectively the precursor drain 12, and/or the deposition space 14.

In general, the precursor injector head being provided with the at least one additional precursor supply, the at least one additional precursor drain, and/or the at least one additional deposition space, being similar to respectively the precursor supply, the precursor drain, and/or the deposition space, offers the possibility of depositing at least two atomic layers without having to change a direction of the relative motion between the deposition space and the substrate in the plane of the substrate surface. In addition, for both translational and rotational motion, the at least one additional precursor supply, with possibly the at least one additional precursor drain, and the at least one additional deposition space increase possibilities for patterned deposition of atomic layer using the apparatus. For example, different precursor materials can be applied patterned in the plane of the substrate surface or out of the plane of the substrate surface. The latter refers for example to stacked monolayers of mutually different composition.

Figure 3:
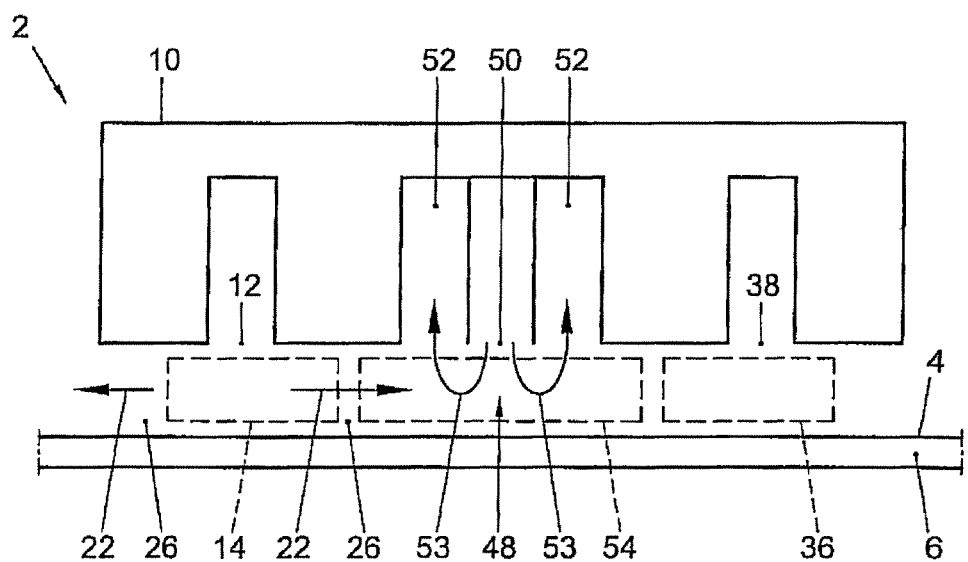
FIG. 3 shows an apparatus in a third embodiment according to the invention.

FIG. 3 shows the apparatus 2 in a third embodiment according to the invention. In this embodiment, the flow barrier is formed by a confining gas curtain 48 in the outer flow path 22. The confining gas curtain in this example is formed by a gas that flows out of a confining gas supply 50, and is drained through confining gas drains 52, wherein the confining gas supply 50 is located between the confining gas drains 52. Alternatively, only one confining gas drain 52 may work together with the confining gas supply 50. The flow of the confining gas curtain is indicated by arrows 53. Alternatively or additionally to the gas curtain, the flow barrier may be provided by a confining gas pressure. The confining gas pressure may be provided by the confining gas curtain, but can also be provided by a gas forced along the flow gap 26 in a direction of the deposition space 14. In general, the apparatus 2 is arranged for regulating the confining gas pressure in the confining gas supply 50 relative to the total gas pressure in the precursor supply 12, for example setting these pressures equal to each other. In that way, draining of the precursor gas through the confining gas drain 52 can be substantially prevented. The total gas pressure may be formed by the precursor gas pressure and a pressure of the carrier gas.

By supplying a buffer gas, for example nitrogen ($N_2$), in the confining gas curtain 48, the apparatus 2 of FIG. 3 is thus arranged for providing a buffer gas curtain adjacent to the deposition space 14, wherein the buffer gas preferably is substantially inert with respect to the precursor gas. A magnitude of a flow rate, a flow direction, and a position of the buffer gas curtain 48 may be arranged for substantially preventing mixing of the precursor gas with other gasses than the buffer gas. The confining gas curtain thus creates a buffer space 54 between the deposition space 14 and the reaction space 36. However, such a buffering function between the deposition space 14 and the reaction space 36 may be absent, and the gas curtain 48 may only have a confining effect on the precursor gas. In particular, this is relevant in case the reaction takes place by other means than by using the reactant gas, for example by using the laser-generated radiation, and/or ultraviolet radiation.

In general, by application of the confining gas curtain and/or the buffer gas curtain, excess precursor gas and/or excess reactant gas can be removed.

Figure 4:
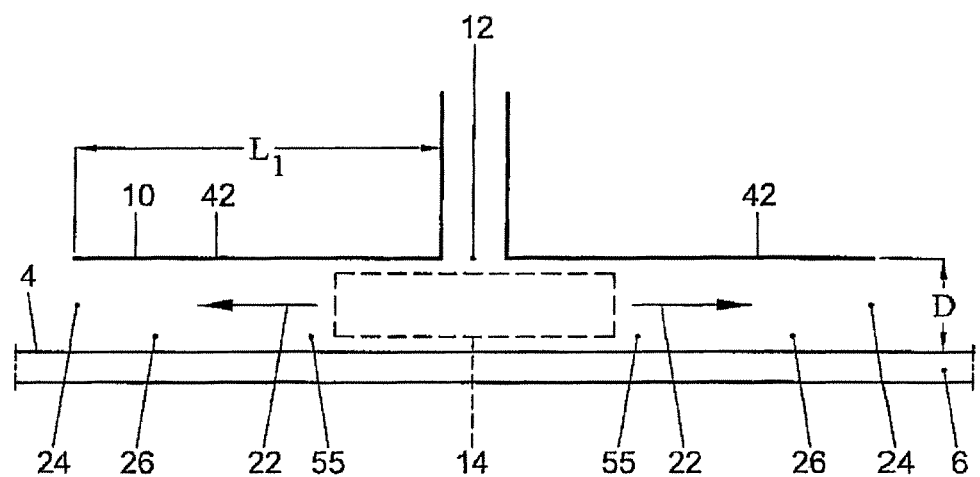
FIG. 4 shows a precursor injector head in a fourth embodiment of an apparatus according to the invention.

FIG. 4 shows the precursor injector head 10 in a fourth embodiment of the apparatus 2 according to the invention. The fourth embodiment constitutes a basic variant of the apparatus 2. The precursor injector head 10 in this variant comprises the precursor supply 12 and the deposition space 14. The flow barrier and the confining structure may be formed by the flow gap 26. A thickness D of the flow gap 26 typically equals 10 micrometer. A length $L_1$ from the precursor supply to the outer environment 24, may typically be in a range from 1 to 10 millimeter.

The apparatus 2 in the fourth embodiment is further arranged for relative motion between the precursor injector head 10 and the substrate 6 in a plane out of the substrate surface 4, i.e. transverse to the substrate surface 4. The relative motion in the plane out of the substrate surface in use may be dependent on a pressure of a gas between the substrate surface 4 and the precursor injector head 10, and/or between the precursor injector head 10 and the substrate holder 16 that is mechanically attached to the substrate 6, the gas thus forming the gas-bearing layer 55. The substrate holder 16 may be mechanically attached to the substrate 6 for example by a light vacuum or by gravity.

The precursor injector head 10 may comprises a gas injector for injecting the gas between the precursor injector head and the substrate surface, the gas thus forming the gas-bearing layer 55. In this embodiment, the gas injector includes the precursor supply 12. In this example, the bearing gas is formed by the precursor gas and the carrier gas. In general, such a gas-bearing layer 55 is suitable for reaching a value of the thickness D of the flow gap 26 that is smaller than 50 micrometer, preferably smaller than 15 micrometer. The flow gap having, in use, a minimum thickness smaller than 15 micrometer, obtained by the gas-bearing layer or by other means, enables formation of a good confining structure for the precursor gas. In general, as a result of the presence of the gas-bearing layer, the precursor injector head 10 may be floating in a direction transverse to the substrate surface 4.

In general, the gas-bearing layer 55 has a surprising effect in that the injected precursor gas can be substantially confined to the deposition space without the need for having a compartment for the precursor gas formed by walls that extend from the side 42 of the precursor injector head in a direction transverse to the side 42. Although not necessary, such walls may be present in the precursor injector head 10. However, it is noted that such walls can be disadvantageous, because they increase an amount of the precursor gas that needs to be injected in order to fill the deposition space. In addition, the walls hinder a remainder of the side 42 to closely approach, for example within a distance of 50 micrometer, the substrate surface 4, thus hindering creation of the gas-bearing layer. An example of a device having such walls can be found in WO2007/126585, wherein the device further lacks arrangement for, in use, confining the precursor gas to the deposition space adjacent to the substrate surface.

Figure 5:
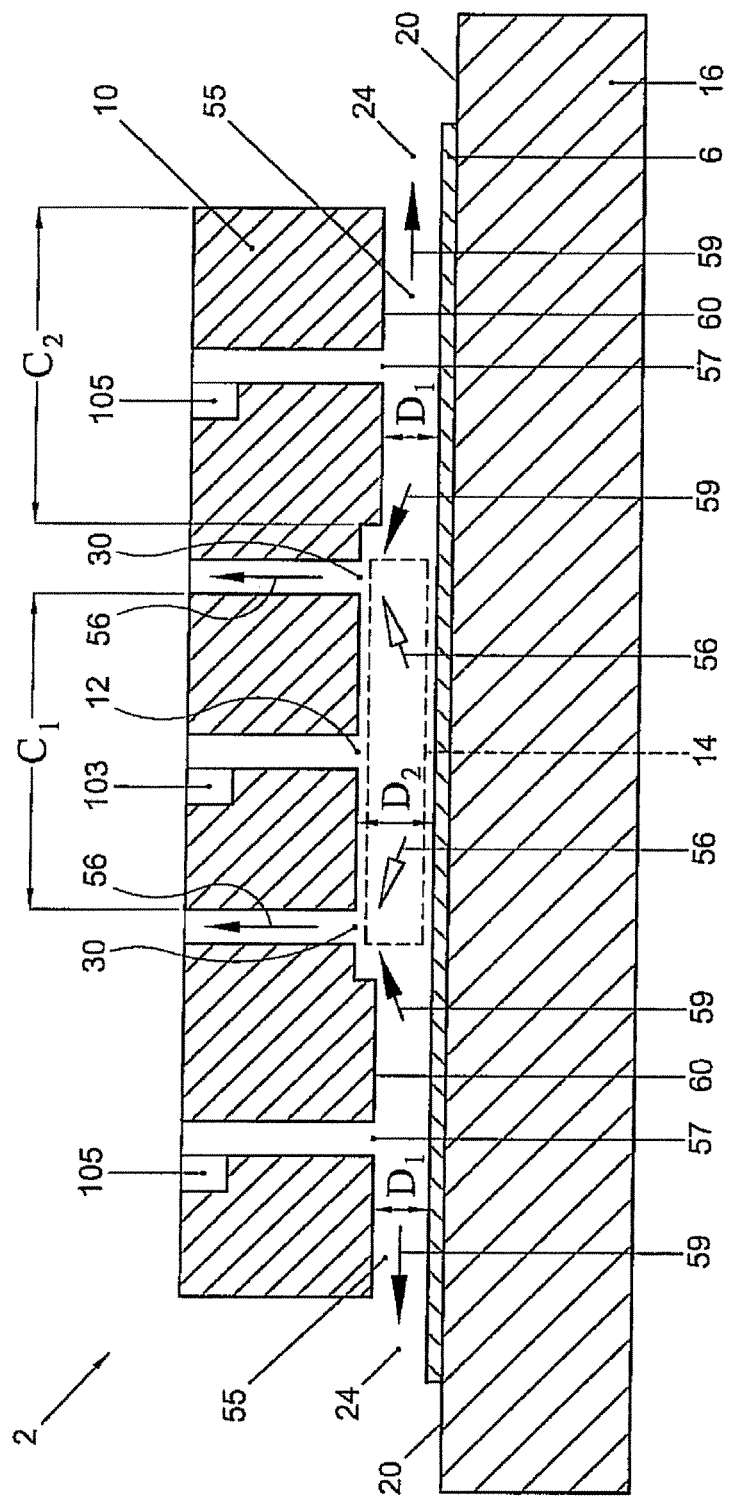
FIG. 5 shows an apparatus in a fifth embodiment according to the invention.

FIG. 5 shows the apparatus 2 in a fifth embodiment according to the invention, having the precursor injector head 10. The precursor injector head 10 in this embodiment comprises the precursor supply 12, the precursor drains 30, and the deposition space 14. Flow of the injected precursor gas, partly along the drain flow path 32, is indicated by arrows 56. The precursor injector head 10 may further comprise the gas injector, in this example a bearing-gas injector, for creating the gas-bearing layer 55. The bearing-gas injector may be separate from the precursor supply 12 and may be provided with a bearing-gas supply 57, in this example two bearing-gas supplies 57. In this example, the bearing gas in use flows to the outer environment 24 or towards and trough the precursor drains 30. Flow of the bearing gas is indicated by arrows 59.

In general, a counterforce to a force in use exerted on the side 42 of the precursor injector head 10 by the bearing gas in the gas-bearing layer 55, may be provided by a weight of the precursor injector head 10. However, the apparatus may be arranged for, in use, applying an additional force to the precursor injector head 10 in a direction transverse to the side 42. The additional force may be directed towards the substrate surface. In this case, the additional force forms a prestressing force on the gas-bearing layer. Alternatively, the additional force may be directed away from the substrate surface. A frame that is mechanically connected, for example via an elastic element like a spring, to the precursor injector head 10 may be used for applying the additional force.

The precursor injector head 10 may be provided with projecting portions 60. The gas-bearing layer in use is for example formed between the projecting portions 60 and the substrate 6, and/or the substrate holder surface 20 of the substrate holder 16. A distance $C_1$ between the precursor drains 30 may typically be in a range from 1 to 10 millimeter, which is also a typical length of the deposition space 14 in the plane of the substrate 6. A typical thickness of the gas-bearing layer, indicated by $D_1$, may be in a range from 3 to 15 micrometer. A typical width $C_2$ of the projecting portion 60 may be in a range from 1 to 30 millimeter. A typical thickness $D_2$ of the deposition space 14 out of the plane of the substrate 6 may be in a range from 3 to 100 micrometer. All of these are considered to be efficient values. Such efficiency follows for example from the possibility to set the thickness $D_2$ of the deposition space differently than the thickness $D_1$ of the gas-bearing layer. This enables more efficient process settings. As a result, for example, a volumetric precursor flow rate injected from the supply 12 into the deposition space 14 can be higher than a volumetric flow rate of the bearing gas in the gas-bearing layer, while a pressure needed the injecting of the precursor gas can be smaller than a pressure needed for injecting the bearing gas a in the gas-bearing layer. It will thus be appreciated that, as is apparent from FIGS. 5, 6, and 7, the thickness $D_1$ of the gas-bearing layer may in general be less than a thickness $D_2$ of the deposition space 14, measured in a plane out of the substrate surface.

More in general, i.a. with respect to such efficiency, the inventor realised that a pressure drop $\Delta p$ due to laminar gas (having density $\rho$ and viscosity $\mu$) flow in a channel having a channel thickness $D_c$, length L, and width W, is given by:

$$\Delta p = \frac{64}{Re} \cdot \frac{L}{D_h} \cdot \frac{1}{2}\rho V^2 \quad [Pa]$$

Where $D_h$ [m] is the channel hydraulic diameter, given by:

$$D_h = \frac{4D_c W}{2W + 2D_c} \quad [m]$$

Figure 6:
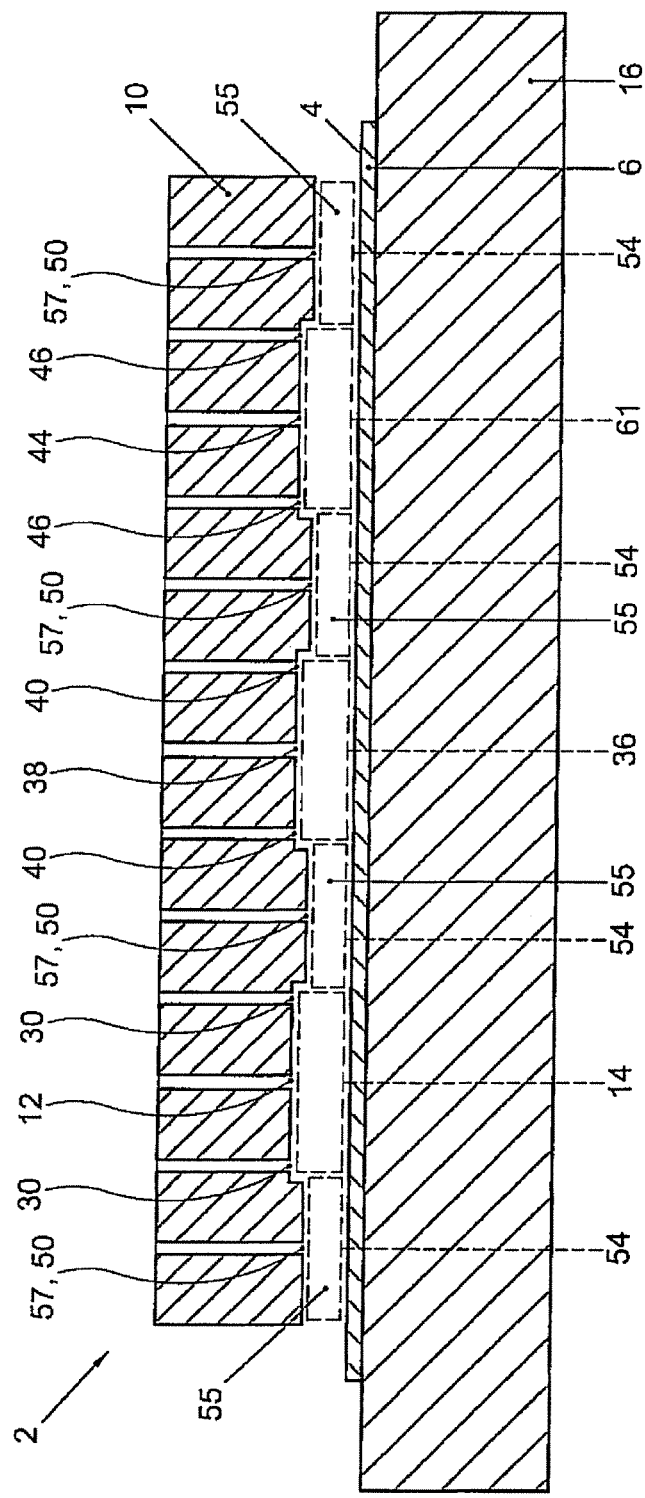
FIG. 6 shows an apparatus in a sixth embodiment according to the invention.
Figure 7:
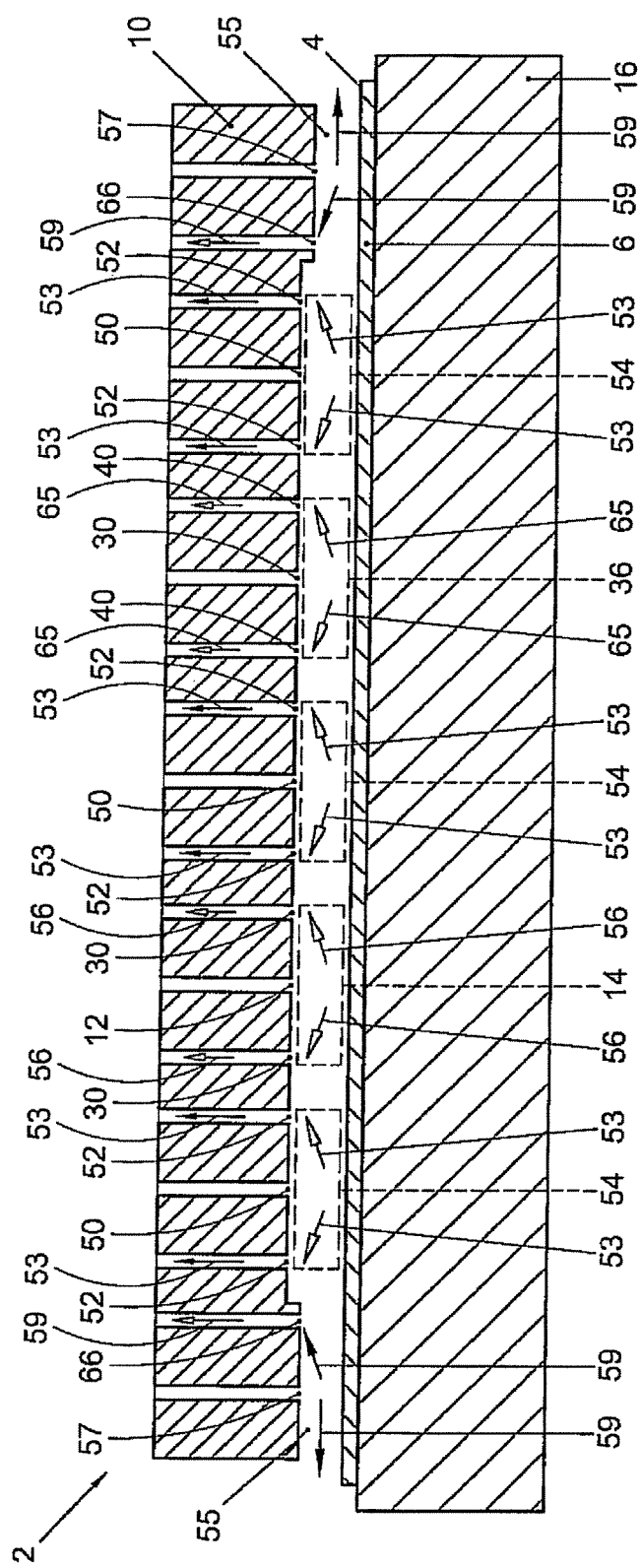
FIG. 7 shows an apparatus in a seventh embodiment according to the invention.

The channel width W is measured in a direction transverse to the mutually transverse directions of the channel thickness $D_c$ and the length L. The channel is for example formed by the flow gap 26 as shown e.g. in FIG. 4. Then, the length L of the channel may be equal to at least part of the length $L_1$ from the precursor supply to the outer environment 24, and/or the thickness $D_c$ may be equal to the thickness D of the flow gap 26. As another example, the length L of the channel may be equal to at least part of the width $C_2$ of the projecting portion 60 shown in FIGS. 5-7, and/or the thickness $D_c$ may be equal to the thickness $D_1$ of the gas-bearing layer 55 shown in FIGS. 5-7. Furthermore, the channel is e.g. formed by the deposition space 14. Then, the length L may equal at least part of a width of the deposition space 14, for example being similar to at least part of the distance $C_1$ between the precursor drains 30 as shown in FIGS. 5-7, and/or the thickness $D_c$ may be equal to the thickness $D_2$ of the deposition space 14, as shown in FIGS. 5-7. Another example of the channel can be the reaction space 36. Assuming that $W \gg L \gg D_c$, which may be a reasonable assumption for the flow gap 26, for the deposition space 14, and/or for the reaction space 36, this can easily be simplified to:

$$D_h \approx 2D_c \, [m]$$

Re [−] is the channel Reynolds number given by:

$$Re = \frac{\rho V D_h}{\mu} \quad [-]$$

V [m/s] is the gas velocity in the channel, which can be expressed as:

$$V = \frac{\Phi}{2WD_c} \quad [m/s]$$

With $\Phi$ [m³/s] the total gas volumetric flow rate. Substitution leads to the following pressure drop in terms of flow rate $\Phi$ and channel thickness $D_c$:

$$\Delta p = \frac{4\mu L \Phi}{WD_c^3} \quad [Pa]$$

Thus, the pressure drop is proportional to the channel thickness to the power of 3. In order to avoid high pressures in the gas delivery system as well as to avoid large pressure gradients in the channel due to friction (and equally unwanted compressibility and gas expansion effects), the ratio of pressure drop to absolute pressure should preferably meet the following requirement:

$$\frac{\Delta p}{p} < 0.2$$

Assuming that deposition takes place at near-atmospheric pressure (p~$10^5$ Pa or 1 bar), the pressure drop should preferably be smaller than ~$2·10^4$ Pa. At a typical flow rate of $5·10^{-4}$-$2·10^{-3}$ m³/s per meter channel width and a typical distance of L=5 mm, e.g being equal to a distance from the precursor supply to the precursor drain, the channel thickness $D_c$, e.g. the thickness $D_2$ of the deposition space 14, should preferably be larger than 25-40 µm. However, the gas-bearing functionality preferably requires much smaller distances from the precursor injector head to the substrate, typically of the order of 5 µm, in order to meet the important demands with respect to stiffness and gas separation and in order to minimize the amount of bearing gas required. The thickness $D_2$ in the deposition space 14 being 5 µm however, with the above-mentioned process conditions, may lead to unacceptably high pressure drops of ~20 bar. Thus, a design of the apparatus 2 with different thicknesses for the gas-bearing layer (i.e. the thickness $D_1$) and deposition space (i.e. the thickness $D_2$) is preferably required. For flat substrates, e.g. wafers—or wafers containing large amounts of low aspect ratio (i.e. shallow) trenches 8 having an aspect ratio A (trench depth divided by trench width)≤10–the process speed depends on the precursor flow rate (in kg/s): the higher the precursor flow rate, the shorter the saturation time.

For wafers containing large amounts of high aspect ratio (i.e. deep narrow) trenches of A≥50, the process speed may depend on the precursor flow rate and on the precursor partial pressure. In both cases, the process speed may be substantially independent of the total pressure in the deposition space 14. Although the process speed may be (almost) independent of total pressure in the deposition space 14, a total pressure in the deposition space 14 close to atmospheric pressure may be beneficial for several reasons:

1. At sub-atmospheric pressures, the gas velocity $v_g$ in the deposition space 14 is desired to increase, resulting in an undesirably high pressure drop along the deposition space 14.
2. At lower pressures, the increase in the gas velocity $v_g$ leads to a shorter gas residence time in the deposition space 14, which has a negative effect on yield.
3. At lower pressures, suppression of precursor leakage from the deposition space 14 through the gas-bearing layer is less effective.
4. At lower pressures, expensive vacuum pumps may be required.

The lower limit of the gas velocity $v_g$ in the deposition space 14 may be determined by the substrate traverse speed $v_s$: in general, in order to prevent asymmetrical flow behavior in the deposition space 14, the following condition should preferably be satisfied:

$$v_g >> v_s$$

This condition provides a preferred upper limit of the thickness D, $D_2$ of the reaction space 36. By meeting at least one, and preferably all, of the requirements mentioned above, an ALD deposition system is obtained for fast continuous ALD on flat wafers and for wafers containing large amounts of high aspect ratio trenches.

The apparatus 2 may include a deposition space pressure controller 103 for controlling the total pressure in the deposition space 14. The apparatus 2 may further comprise a gas-bearing layer pressure controller 105 for controlling the pressure in the gas-bearing layer. The deposition space pressure controller 103 may be arranged for applying the prestressing force by setting the total pressure in the deposition space 14, for example setting the total pressure below atmospheric pressure, preferably in a range from 0.1 to 10 millibar. The gas-bearing layer pressure controller 105 may be arranged for applying the pressure in the gas-bearing layer substantially above the total pressure in the deposition space.

FIG. 6 shows the apparatus 2 in a sixth embodiment according to the invention. The apparatus 2 in this embodiment includes the precursor injector head 10 comprising the precursor supply 12, the precursor drains 30, and the deposition space 14. The precursor injector head 10 may further comprise the reactant supply 38, the reactant drains 40, and the reaction space 36.

The precursor injector head 10 may further comprise the additional precursor supply 44, the additional precursor drains 46, and the additional deposition space 61. The additional precursor supply 44 may be used for supplying a different precursor gas than supplied from the precursor supply 12, thus enabling application of stacked layers of different composition.

In the precursor injector head 10 in the sixth embodiment, the bearing-gas supply 57 forms the confining gas supply 50. The gas-bearing layer may form the confining structure and/or the flow barrier. Such integration enhances a compactness of the precursor injector head 10. As a result, the buffer space 54 at least partly overlaps with the gas-bearing layer 55.

In this embodiment, the gas-bearing layer can also be considered as being arranged for providing the confining gas curtain and/or the confining pressure in the outer flow path. The gas-bearing layer may, in use, determine a value of the flow gap.

In use, the total gas pressure in the deposition space 14 may be different from a total gas pressure in the additional deposition space 61 and/or a total gas pressure in the reaction space 36. The total gas pressure in the deposition space 14 and/or the total gas pressure in the additional deposition space 61 may be in a range from 0.2 to 3 bar, for example 0.5 bar or 2 bar. Such pressure values may be chosen based on properties of the precursor, for example a volatility of the precursor. In addition, the apparatus may be arranged for balancing the bearing gas pressure and the total gas pressure in the deposition space, in order to minimize flow of precursor gas out of the deposition space.

FIG. 7 shows the apparatus 2 in a seventh embodiment according to the invention. The apparatus 2 in this embodiment includes the precursor injector head 10 comprising the precursor supply 12, the precursor drains 30, and the deposition space 14. The precursor injector head 10 may further comprise the reactant supply 38, the reactant drains 40, and the reaction space 36. Flow of the precursor gas, in use of this embodiment, is indicated by the arrows 56, while flow of the reactant gas, in use, is indicated by arrows 65.

The precursor injector head 10 may also comprise the bearing-gas supplies 57. In addition, the precursor injector head 10 may be provided with bearing-gas drains 66, further enabling flow control of the bearing gas. Flow of the bearing gas after injection is indicated by arrows 59. The precursor injector head 10 may also comprise the confining gas supplies 50 and the confining gas drains 52, in this example used for injecting the buffer gas. Buffer gas flow is indicated by the arrows 53. Having separate flow systems for establishing the gas-bearing layer 55 and for establishing the buffer space 54 enables a better process control.

It may be clear that, in the embodiments shown in FIGS. 5-7, the projecting portions 60 are provided with the bearing-gas supplies 57.

Figure 8A:
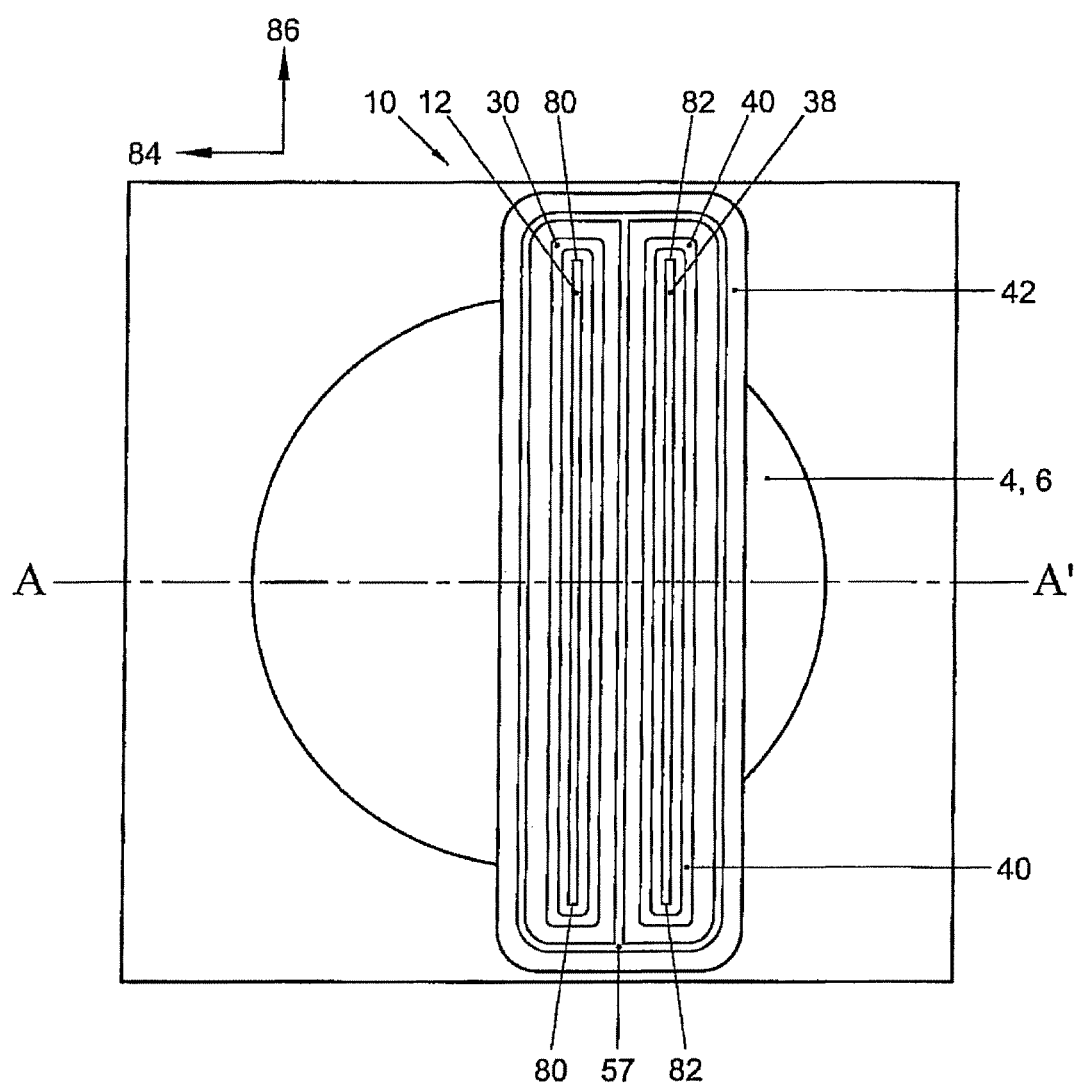
FIG. 8A shows a precursor injector head near a side of a precursor injector head that, in use, faces a substrate surface, in a transparent view through a precursor injector head.
Figure 8B:
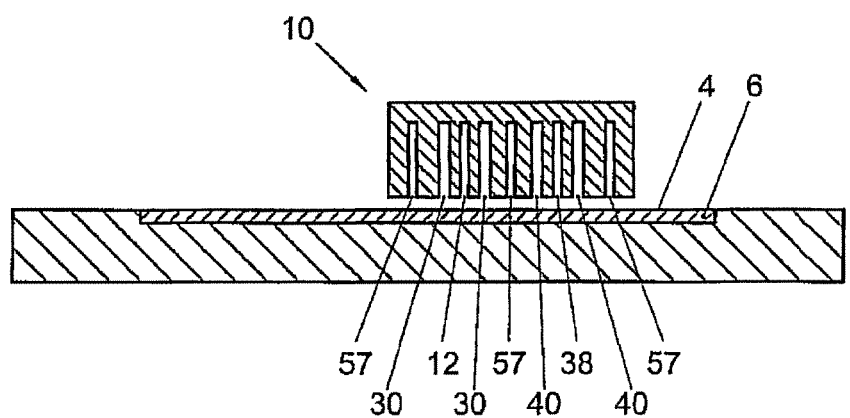
FIG. 8B shows a precursor injector head in a cross section.

FIGS. 8A and 8B show the precursor injector head 10 in an eighth embodiment according to the invention. FIG. 8A shows the precursor injector head 10 near the side 42 of the precursor injector head 10 that, in use, faces the substrate surface 4, in a transparent view through the precursor injector head 10. FIG. 8B shows the precursor injector head 10 in a cross section A-A', indicated in FIG. 8A. The precursor injector head 10 may include the precursor supply slit and the precursor drain slit 30. In addition, the precursor slit may include a bearing-gas supply slit 57. The bearing-gas supply slit in this embodiment is arranged for providing the confining structure, formed by the gas-bearing layer, around the precursor supply slit 57. The confining structure, in this example the gas-bearing layer, may extend around ends 80 of the precursor supply slit 12. As a result, confinement of the precursor gas to the deposition space 14 is not hindered near the ends 80 and 82 of the precursor supply slit 12.

The precursor injector head 10 further includes a reactant supply slit 38 and a reactant drain slit 40. The confining structure, in this example the gas-bearing layer, may extend around ends 82 of the reactant supply slit 38.

The precursor injector head 10 in this embodiment may be arranged for flow of the precursor gas in a direction 84 transverse to a longitudinal direction 86 of the precursor supply slit 12.

In general, the precursor injector head 10, preferably measured along the precursor supply slit 12, may be larger than a dimension, such as a diameter, of the substrate 6. This enables deposition of the atomic layer on the whole surface 4 of the substrate 6.

Figure 8C:
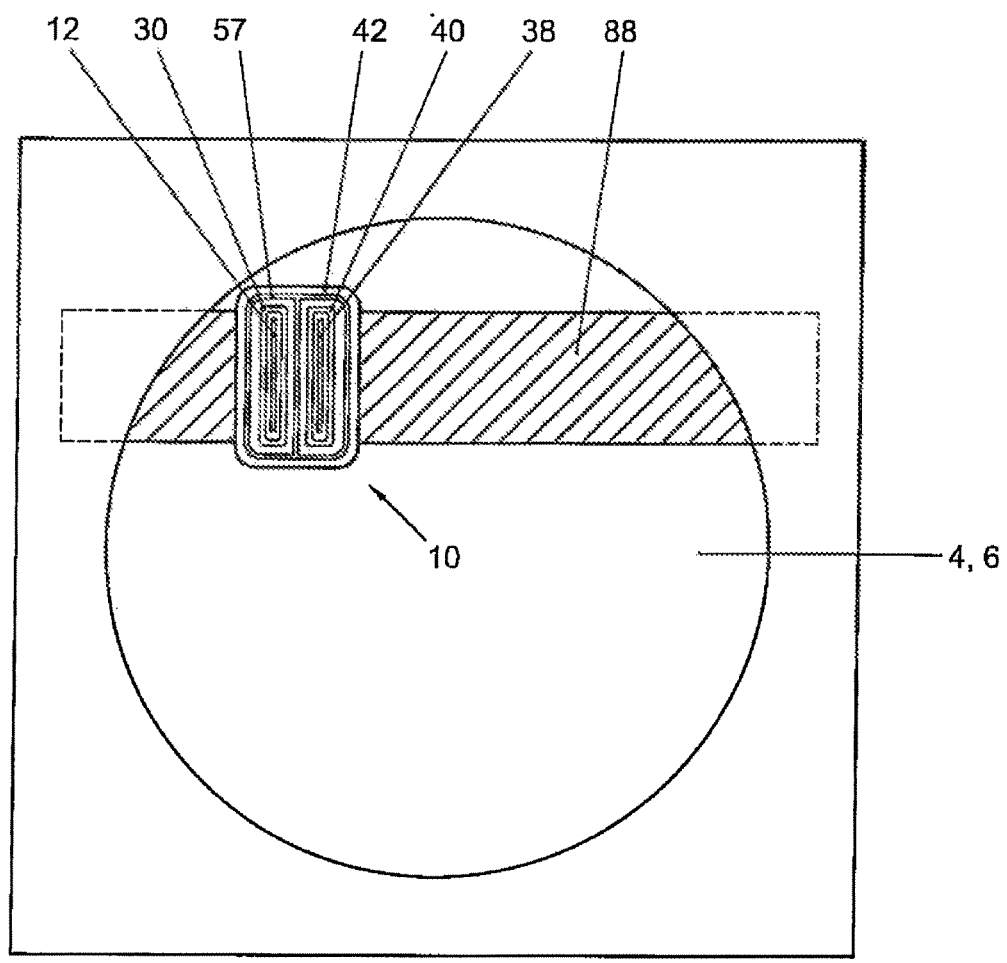
FIG. 8C shows a precursor injector head in a ninth embodiment according to the invention.

FIG. 8C shows the precursor injector head 10 in a ninth embodiment according to the invention. Analogously to FIG. 8A, FIG. 8C shows the precursor injector head 10 near the side 42 of the precursor injector head 10 that, in use, faces the substrate surface 4, in a transparent view through the precursor injector head 10. In general, the precursor injector head 10, preferably measured along the precursor supply slit 12, may be substantially smaller than a dimension, such as a diameter, of the substrate 6. This enables deposition of the atomic layer on a part of the surface 4 of the substrate 6, in this example the part 88.

Figure 9A:
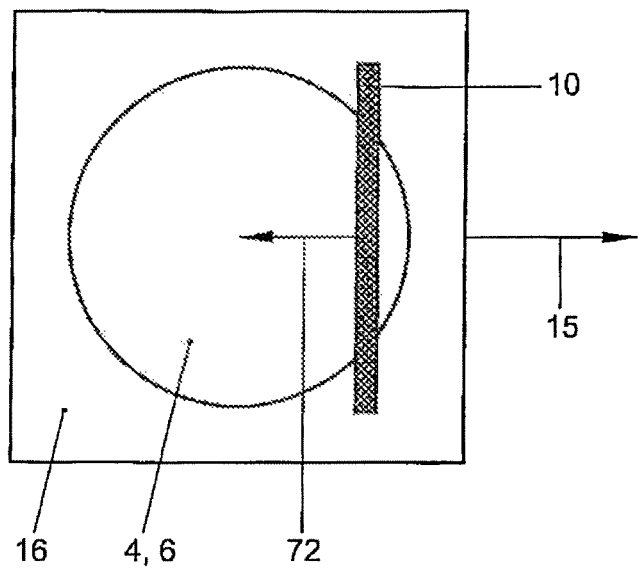
FIG. 9A shows relative translational motion between a substrate and a precursor injector head.
Figure 9B:
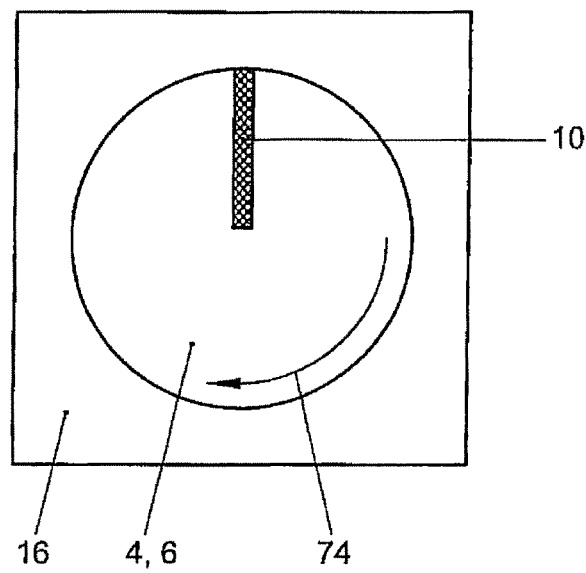
FIG. 9B shows rotational motion of a substrate with respect to a precursor injector.
Figure 9C:
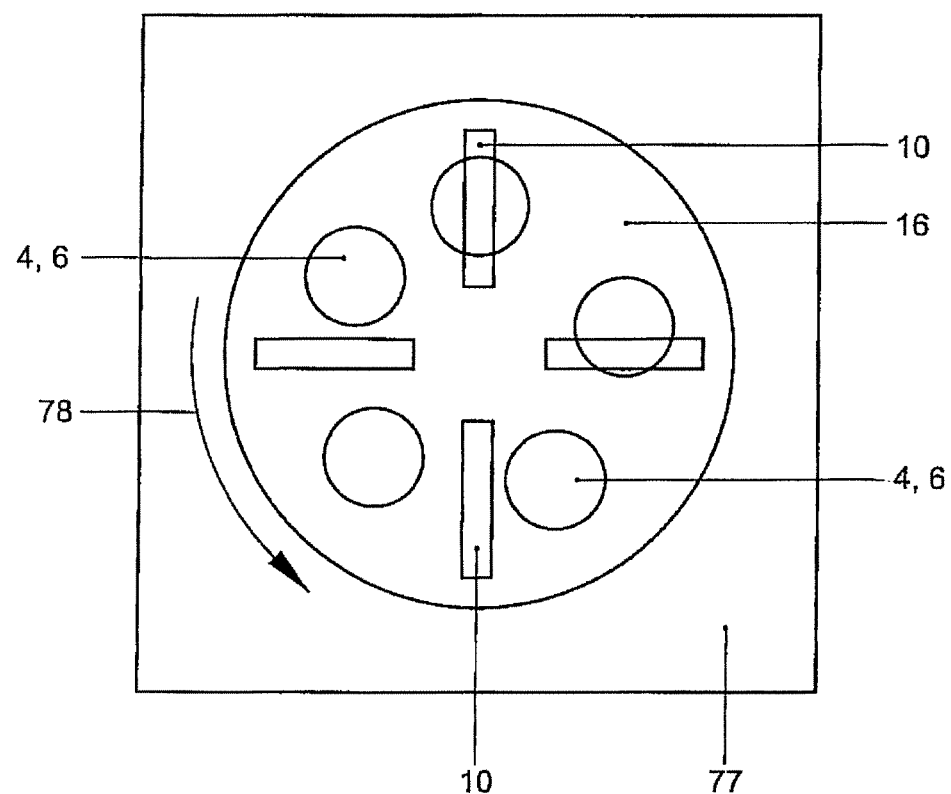
FIG. 9C shows combined rotational and translation motion of a plurality of substrates with respect to a plurality of precursor injector heads.

FIGS. 9A-C illustrate different examples of the relative motion between the substrate 6 and the precursor injector head 10 comprising the precursor supply 12 and the deposition space 14. In this example, the substrate 6 is placed on the substrate holder 16. FIG. 9A shows relative translational motion between the substrate 6 and the precursor injector head 10. The precursor injector head 10 may be substantially motionless, while the substrate 10 may be in motion, indicated by the arrow 15. Alternatively or additionally, the substrate holder 16 may be substantially motionless, and the precursor injector head 10 may be in translational motion, indicated by arrow 72.

FIG. 9B shows rotational motion of the substrate 6 with respect to the precursor injector head 10, indicated by the arrow 74. In this example, the precursor injector head 10 is substantially motionless. Alternatively, the precursor injector head 10 may be in rotational motion with respect to the substrate 6, indicated by the arrow 76. In this example, the substrate 6 is substantially motionless. Such rotational relative motion offers the advantage that deposition on the substrate holder surface 20 can be omitted. Rotational motion may take place relative to more than one precursor injector head 10, for example four precursor injector heads 10. The four precursor injector heads 10 may be positioned along the rotational direction 74 with a rotational interval substantially equal to 90 degrees. FIG. 9C shows combined rotational and translation motion of a plurality of substrates 6 with respect to a plurality of precursor injector heads 10. In this example, the substrate holder 16 is arranged for translation motion with respect to the frame 77 of the apparatus. By rotating at least one of the substrate holder 16 and the plurality of precursor injector heads 10 along or against arrow 78, the combined rotational and translation motion can be established. In this way, complete coverage of the substrate surfaces 4 can be achieved.

Figure 10:
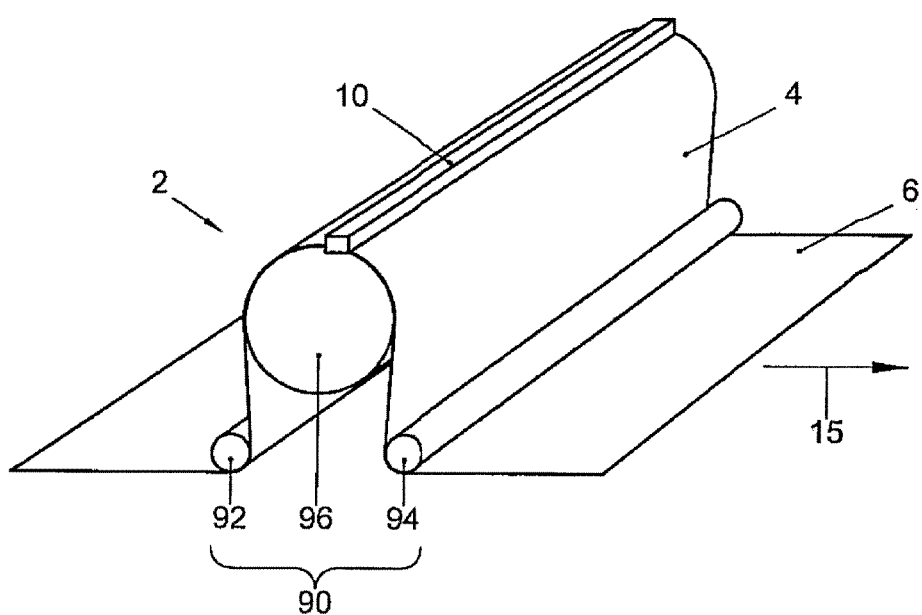
FIG. 10 shows an apparatus in a fifth embodiment according to the invention.

FIG. 10 shows the apparatus 2 in a tenth embodiment according to the invention. The apparatus 2 in the tenth embodiment includes a reel-to-reel system 90 including a first roll 92, a second roll 94, and a rotating drum 96. The rotating drum may be absent so that the substrate 6 is substantially flat at a position of the precursor injector head 10. The reel-to-reel system 90 is an example of the positioning system. The reel-to-reel system 90 may be arranged for relative motion between the deposition space 14 and the substrate 6 in the plane of the substrate surface 4, by including the reel-to-reel system 90 arranged for moving the substrate 6 in the plane of the substrate surface 4. In this example, the plane of the substrate surface 4 is a curved plane. The relative motion, in this example translational motion, is indicated by the arrow 15.

The substrate 6, and/or the substrate holder 16, in the reel-to-reel system is relatively susceptible for undesired movement out of the plane of the substrate 6 due to flexibility of the substrate 6. Such undesired movement can result for example from vibrations. In general, the apparatus 2 arranged for relative motion between the precursor supply and the substrate in a plane out of the substrate surface, for example the apparatus 2 in the fourth, fifth, sixth, seventh, eight, and/or ninth embodiment, may be especially suitable for application with a reel-to-reel system. The gas-bearing layer enables the precursor injector head to, at least partly, follow the undesired movement, thus avoiding contact between the precursor injector head 10 and the substrate 6 and enabling in use a closer approach of the precursor injector head to the substrate surface.

Although it may not be explicitly indicated, any apparatus according to the first, second, third, fourth, fifth, sixth, seventh, eight, ninth, and/or tenth embodiment may have features of the apparatus in another one of the first, second, third, fourth, fifth, sixth, seventh, eight, ninth, and/or tenth embodiment.

The invention also includes a method for atomic layer deposition. A first embodiment of the method according to the invention, hereafter referred as the first method, will be explained using the apparatus 2 in the first embodiment. The first method is used for atomic layer on the surface 4 of the substrate 6 using the apparatus 2 including the precursor injector head 10. The first method comprises the step of injecting the precursor gas from the precursor supply 12 into the deposition space 14 for contacting the substrate surface 4. In addition, the first method comprises the step of establishing relative motion between the deposition space 14 and the substrate 6 in the plane of the substrate surface 4. The first method further comprises the step of confining the injected precursor gas to the deposition space 14 adjacent to the substrate surface 6, to provide a deposition space 14 that in use is bounded by the precursor injector head 10 and the substrate surface 4.

The first method may further comprise the step of providing the reactant gas, the plasma, laser-generated radiation, and/or ultraviolet radiation, in the reaction space 36 for reacting the precursor after deposition of the precursor gas on at least part of the substrate surface 4 in order to obtain the atomic layer on the at least part of the substrate surface 4.

The first method may also include providing the gas-bearing layer in a gap, for example the flow gap 26 and/or the deposition gap 28, between the precursor injector head 10 and the substrate surface 4.

In general, the first method may include establishing repeated relative motion between the deposition space and the substrate in the plane of the substrate surface, wherein repeatedly relative motion in one direction is followed by relative motion in another, opposite, direction. For example, motion of the substrate in the direction indicated by arrow 15 in FIG. 9A is followed motion in a direction opposite to arrow 15, which is again followed by motion in the direction of arrow 15. The precursor injector head 10, in the sixth embodiment for example, that is provided with the reaction space or the additional reaction space at two opposite sides of the deposition space is especially suitable for use according to this aspect of the first method, as this enables reaction after deposition in either one of the opposite directions.

The apparatus 2 in one of the described embodiments can also be applied in a modified state separate from the invention, arranged for etching instead of atomic layer deposition. In this modified state, the precursor injector head is arranged for injecting an etching gas instead of a precursor gas. Advantages related to efficiency of use of the etching gas and speed of the etching process are similar as those related to efficiency of use of the precursor gas and speed of the atomic layer deposition process.

Further aspects of the disclosed embodiments may include: the apparatus, wherein in use the deposition space has an elongated shape in a plane of the substrate surface; the apparatus, wherein in use the deposition space of the apparatus is formed by a deposition gap between the substrate surface and the precursor injector head, preferably having a minimum thickness smaller than 50 micrometer, more preferably smaller than 15 micrometer; the apparatus, wherein a size of the reaction space along the substrate surface, in a direction of the relative motion between the precursor supply and the substrate in the plane of the substrate surface, is substantially smaller than a size of the substrate surface in the direction of the relative motion between the precursor supply and the substrate in the plane of the substrate surface; the apparatus, arranged for providing a reactant gas, and optionally a plasma, laser-generated radiation, and/or ultraviolet radiation, in a reaction space for reacting the precursor with the reactant gas after deposition of the precursor gas on at least part of the substrate surface in order to obtain the atomic layer on the at least part of the substrate surface; the provided with an atomic layer deposition head that includes the precursor supply, the reactant supply, the deposition space and the reaction space, the apparatus being arranged for relative motion between the atomic layer deposition head and the substrate in a plane of the substrate surface; the apparatus, arranged for providing a buffer gas curtain adjacent to the deposition space, wherein the buffer gas is substantially inert with respect to the precursor gas, and a magnitude of a flow rate, a flow direction, and a position of the buffer gas curtain is arranged for substantially preventing mixing of the precursor gas with other gasses than the buffer gas; the apparatus, wherein the buffer gas curtain is arranged for forming the confining structure; the apparatus, wherein the precursor supply and/or the precursor drain is formed by respectively at least one precursor supply slit and/or at least one precursor drain slit; and/or the apparatus, wherein the precursor injector head is provided with at least one additional precursor supply, at least one additional precursor drain, and/or at least one additional deposition space, being similar to respectively the precursor supply, the precursor drain, and/or the deposition space.

The invention is not limited to any embodiment herein described and, within the purview of the skilled person, modifications are possible which may be considered within the scope of the appended claims. Equally all kinematic inversions are considered inherently disclosed and to be within the scope of the present invention. The use of expressions like: "preferably", "in particular", "typically", etc. is not intended to limit the invention. The indefinite article "a" or "an" does not exclude a plurality. Features which are not specifically or explicitly described or claimed may be additionally included in the structure according to the present invention without deviating from its scope.

The invention claimed is:

1. An apparatus for atomic layer deposition on a substrate surface, the apparatus comprising:

a precursor injector head, the precursor injector head comprising one or more precursor supplies and a deposition space that in use is bounded by the precursor injector head and the substrate surface, wherein the precursor injector head is arranged for injecting a precursor gas from the one or more precursor supplies into the deposition space for contacting the substrate surface to yield injected precursor gas, wherein the apparatus is arranged for relative motion between the deposition space and the substrate surface in a plane of the substrate surface, wherein the precursor injector head comprises a gas injector for injecting a gas between the precursor injector head and the substrate surface, the gas thus forming a gas-bearing layer, wherein the apparatus is further arranged for relative motion between the precursor injector head and the substrate surface in a plane out of the substrate surface that is dependent on a pressure of the gas between the substrate surface and the precursor injector head, wherein the gas injector is formed by a bearing-gas injector, which is separate from the one or more precursor supplies, for creating the gas-bearing layer, and in that the precursor injector head is provided with projecting portions, wherein, in use, the gas-bearing layer is formed between the projecting portions and a substrate for increasing the pressure in the gas bearing layer, the gas-bearing layer and the projecting portions thereby forming a confining structure for confining the injected precursor gas to the deposition space adjacent to the substrate surface, and wherein a thickness of the gas-bearing layer is less than a thickness of the deposition space measured in a plane out of the substrate surface, wherein the precursor injector head further comprises at least one precursor drain arranged for draining the precursor gas, wherein the at least one precursor drain is configured to drain within the confining structure on at least two sides of the at least one of the one or more precursor supplies in the deposition space, and wherein the precursor injector head further comprises a deposition space pressure controller and a gas-bearing layer pressure controller, both the deposition space pressure controller and the gas-bearing layer pressure controller configured to control the precursor injector head to float on the substrate surface within a defined range or at a defined distance, wherein the deposition space pressure controller sets a pre-stressing force by setting a total pressure in the deposition space and wherein the gas-bearing layer pressure controller counteracts the pre-stressing force by controlling a pressure in the gas-bearing layer, and wherein the precursor injector head is smaller than a size of the substrate.

2. The apparatus according to claim 1, wherein said pre-stressing force, in use, being formed by at least one of a total gas pressure in the deposition space being below a pressure in an outer environment of the precursor injector head; magnetically; gravitationally by an added weight to the precursor injector head; a spring or another elastic element; and/or separate from the pressure in the deposition space, an applied gas pressure in between the precursor injector head and the substrate that is below the pressure in the outer environment of the precursor injector head.

3. The apparatus according to claim 1, wherein the confining structure is further formed by a flow barrier for the precursor gas along an outer flow path arranged, in use, between the precursor injector head and the substrate surface to an outer environment, for substantially impeding a volumetric flow rate of the precursor gas along the outer flow path compared to a volumetric flow rate of the injected precursor gas.

4. The apparatus according to claim 3, wherein the gas bearing layer forms the flow barrier.

5. The apparatus according to claim 4, wherein the flow barrier is formed by a confining gas curtain and/or a confining gas pressure in the outer flow path.

6. The apparatus according to claim 3, wherein the flow barrier is formed by a flow gap between the precursor injector head and the substrate surface and/or between the precursor injector head and a surface that extends from the substrate surface in a plane of the substrate surface, wherein a thickness and length of the flow gap along the outer flow path are adapted for substantially impeding the volumetric flow rate of the precursor gas along the outer flow path compared to the volumetric flow rate of the injected precursor gas.

7. The apparatus according to claim 3, wherein the flow barrier is formed by a confining gas curtain and/or a confining gas pressure in the outer flow path.

8. The apparatus according to claim 1, wherein, in use, and as a result of the precursor injector head being provided with the projecting portions and the gas-bearing layer being formed between the projecting portions and the substrate and/or being formed between the projecting portions and a substrate holder surface of a substrate holder, a thickness of the gas-bearing layer is less than a thickness of the deposition space, measured in a plane out of the substrate surface.

9. The apparatus according to claim 8, wherein, in use, the thickness of the gas-bearing layer is in a range from 3 to 15 micrometer, and/or the thickness of the deposition space out of the plane of the substrate surface is in a range from 3 to 100 micrometer.

10. The apparatus according to claim 1, wherein the one or more precursor supplies are formed by a slit having an undulated shape.

11. The apparatus according to claim 1, arranged for providing a plasma in a reaction space for reacting the one or more precursor supplies with reactant gas after deposition of the precursor gas on at least part of the substrate surface in order to obtain an atomic layer on the at least part of the substrate surface.

12. The apparatus according to claim 1, wherein the confining structure is further formed by the projecting portions of the precursor injector head.

13. The apparatus according to claim 1, wherein the projecting portions are provided with a bearing-gas supply.

14. The apparatus according to claim 1, wherein the deposition space has a planar or curved elongated shape in the plane of the substrate surface.

15. The apparatus according to claim 1, wherein the precursor injector head is arranged for injecting the precursor gas from the one or more precursor supplies via the deposition space to the precursor drain, wherein the projecting portions are free of the precursor drain.

16. The apparatus according to claim 1, wherein the apparatus further comprises a drain flow path extending from the at least one precursor drain, and arranged for substantially facilitating a volumetric flow rate of the precursor gas along the drain flow path.

17. The apparatus according to claim 1, wherein the at least one precursor drain is circumferentially arranged around the one or more precursor supplies in the deposition space.

18. The apparatus according to claim 1, wherein the at least two drawing stations comprises a trailing drawing station on a first side of all of the one or more precursor supplies and a leading drawing station on a second side of all of the one or more precursor supplies.

19. The apparatus of claim 1, wherein the pressure of the gas between the substrate surface and the precursor injector head is in a range from 0.01 to 100 millibar.

20. An apparatus for atomic layer deposition on a substrate surface, the apparatus comprising:

a precursor injector head, the precursor injector head comprising a precursor supply and a deposition space that in use is bounded by the precursor injector head and the substrate surface, wherein the precursor injector head is arranged for injecting a precursor gas from the precursor supply into the deposition space for contacting the substrate surface to yield injected precursor gas, wherein the apparatus is arranged for relative motion between the deposition space and the substrate surface in a plane of the substrate surface, wherein the precursor injector head comprises a gas injector for injecting a gas between the precursor injector head and the substrate surface and/or between the precursor injector head and a substrate holder that is mechanically attached to the substrate, the gas thus forming a gas-bearing layer, wherein the apparatus is further arranged for relative motion between the precursor injector head and the substrate surface in a plane out of the substrate surface that is dependent on a pressure of the gas between the substrate surface and the precursor injector head, wherein the gas injector is formed by a bearing-gas injector, which is separate from the precursor supply, for creating the gas-bearing layer, and in that the precursor injector head is provided with projecting portions, wherein, in use, the gas-bearing layer is formed between the projecting portions and the substrate for increasing the pressure in the gas bearing layer, the gas-bearing layer and the projection portions thereby forming a confining structure for confining the injected precursor gas to the deposition space adjacent to the substrate surface, and wherein a thickness of the gas-bearing layer is less than a thickness of the deposition space measured in a plane out of the substrate surface, wherein the precursor injector head further comprises at least one precursor drain arranged for draining the precursor gas, wherein the at least one precursor drain is configured to drain within the confining structure on at least two sides of the precursor supply in the deposition space, and wherein the precursor injector head further comprises a deposition space pressure controller and a gas injector, both the deposition space pressure controller and the gas injector configured to control the precursor injector head to float on the substrate surface within a defined range or at a defined distance, wherein the deposition space pressure controller sets a pre-stressing force by setting a total pressure in the deposition space, wherein the gas injector counteracts the pre-stressing force by controlling a pressure in the gas-bearing layer, and wherein the precursor injector head is smaller than a size of the substrate.

* * * * *